(12) United States Patent
Ozalevli et al.

(10) Patent No.: US 11,936,352 B2
(45) Date of Patent: Mar. 19, 2024

(54) AMPLIFIER CIRCUIT WITH DISTRIBUTED DYNAMIC CHOPPING

(71) Applicant: Apple Inc., Cupertino, CA (US)

(72) Inventors: Erhan Ozalevli, Santa Clara, CA (US); Evaldo M. Miranda, Jr., Saratoga, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/154,939

(22) Filed: Jan. 21, 2021

(65) Prior Publication Data

US 2021/0305953 A1   Sep. 30, 2021

Related U.S. Application Data

(60) Provisional application No. 63/002,076, filed on Mar. 30, 2020.

(51) Int. Cl.
   *H03F 3/45* (2006.01)
   *H03F 3/387* (2006.01)
   *H03K 5/24* (2006.01)

(52) U.S. Cl.
   CPC ......... *H03F 3/45076* (2013.01); *H03F 3/387* (2013.01); *H03K 5/24* (2013.01); *H03F 2200/375* (2013.01)

(58) Field of Classification Search
   CPC .. H03F 3/45475; H03F 3/45076; H03F 3/387; H03F 2200/375; H03K 5/24

(Continued)

(56) References Cited

U.S. PATENT DOCUMENTS 6,331,846 B1 * 12/2001 Nakao .................. G09G 3/3614
                                                   330/252
6,621,334 B2    9/2003 Ausserlechner et al.
(Continued)

FOREIGN PATENT DOCUMENTS

WO    WO-2016009924 A1 *  1/2016  ............... H03F 3/34

OTHER PUBLICATIONS

Said, A.H., "Design of a Chopper Amplifier for Use in Biomedical Signal Acquisition," Department of Electrical and Computer Engineering in the Graduate School Southern Illinois University, Dec. 2010, pp. 1-92.

(Continued)

*Primary Examiner* — Quan Tra
(74) *Attorney, Agent, or Firm* — Sterne, Kessler, Goldstein & Fox, P.L.L.C.

(57) ABSTRACT

Embodiments relate to an amplifier circuit. The amplifier circuit includes multiple transistors. Each transistor is configured to receive an input signal and output an amplified signal. The amplifier circuit additionally includes a set of input chopper circuits and a set of output chopper circuits. Each output chopper circuit corresponds to one input chopper of the set of input choppers. Each input chopper circuit and its corresponding output chopper are controlled by one or more control signals from a set of control signals. Each input chopper circuit is configured to selectively connect each transistor of a transistor pair to a first input terminal or a second input terminal based on a value of the one or more control signals. Moreover, each output chopper circuit is configured to selectively connect each transistor of the transistor pair to a first output terminal or a second output terminal based on the value of the one or more control signals.

24 Claims, 17 Drawing Sheets

(58) Field of Classification Search
USPC .......................................................... 330/9
See application file for complete search history.

(56) References Cited

U.S. PATENT DOCUMENTS

| | | | |
|---|---|---|---|
| 6,734,723 | B2 | 5/2004 | Huijsing et al. |
| 7,336,123 | B2 | 2/2008 | Yoshida et al. |
| 7,733,156 | B2* | 6/2010 | Brederlow ................ H03F 1/26 327/389 |
| 7,834,685 | B1* | 11/2010 | Pertijs ............ H03K 19/018521 327/124 |
| 9,197,173 | B2 | 11/2015 | Denison et al. |
| 10,116,268 | B2 | 10/2018 | Vijaykumar et al. |
| 2003/0080810 | A1* | 5/2003 | Reber ................ H03F 3/45775 330/9 |
| 2004/0140847 | A1* | 7/2004 | Thompson .............. H03F 3/217 330/9 |
| 2006/0098271 | A1 | 5/2006 | Koller et al. |
| 2006/0103463 | A1* | 5/2006 | Lee ........................... H03F 3/72 330/254 |
| 2009/0027116 | A1 | 1/2009 | Bach |
| 2012/0032722 | A1 | 2/2012 | Mulder |
| 2015/0054576 | A1* | 2/2015 | Zhou ................... H03F 3/45192 330/9 |
| 2018/0091105 | A1* | 3/2018 | Abughazaleh ...... H03F 3/45183 |
| 2021/0006218 | A1* | 1/2021 | Tokunaga ........... H03F 3/45183 |

OTHER PUBLICATIONS

United States Office Action, U.S. Appl. No. 17/204,873, dated Sep. 7, 2022, eight pages.

* cited by examiner

AMPLIFIER CIRCUIT WITH DISTRIBUTED DYNAMIC CHOPPING

CROSS REFERENCE TO RELATED APPLICATIONS

This application claims the benefit of U.S. Provisional Application No. 63/002,076, filed Mar. 30, 2020, which is incorporated by reference in its entirety.

BACKGROUND

1. Field of the Disclosure

The present disclosure relates an amplifier circuit and more specifically to a differential amplifier architecture for reducing an amplifier offset due to mismatches in the amplifier circuit.

2. Description of the Related Arts

Differential amplifier circuits use pairs of transistors to amplify the difference between two input voltages. However, due to mismatches in the pairs of transistors, the differential amplifier may add a DC offset to the output. In particular, the differential amplifier introduces an offset that is dependent on the difference in the threshold voltages of the pair of transistors. The DC offset introduced by a differential amplifier together with 1/f noise and drift are some of the major sources of error in operational amplifiers.

SUMMARY

Embodiments relate to an amplifier circuit with multiple transistors and chopper circuits that are selectively connected to the transistors. Each transistor receives an input signal and outputs an amplified signal. The chopper circuits include a set of input chopper circuits and a set of output chopper circuits. Each output chopper circuit corresponds to one input chopper of the set of input choppers. Each input chopper circuit and its corresponding output chopper are controlled by one or more control signals from a set of control signals. Each input chopper circuit is configured to selectively connect each transistor of a transistor pair to a first input terminal or a second input terminal based on a value of the one or more control signals. Moreover, each output chopper circuit is configured to selectively connect each transistor of the transistor pair to a first output terminal or a second output terminal based on the value of the one or more control signals.

Figure 1:
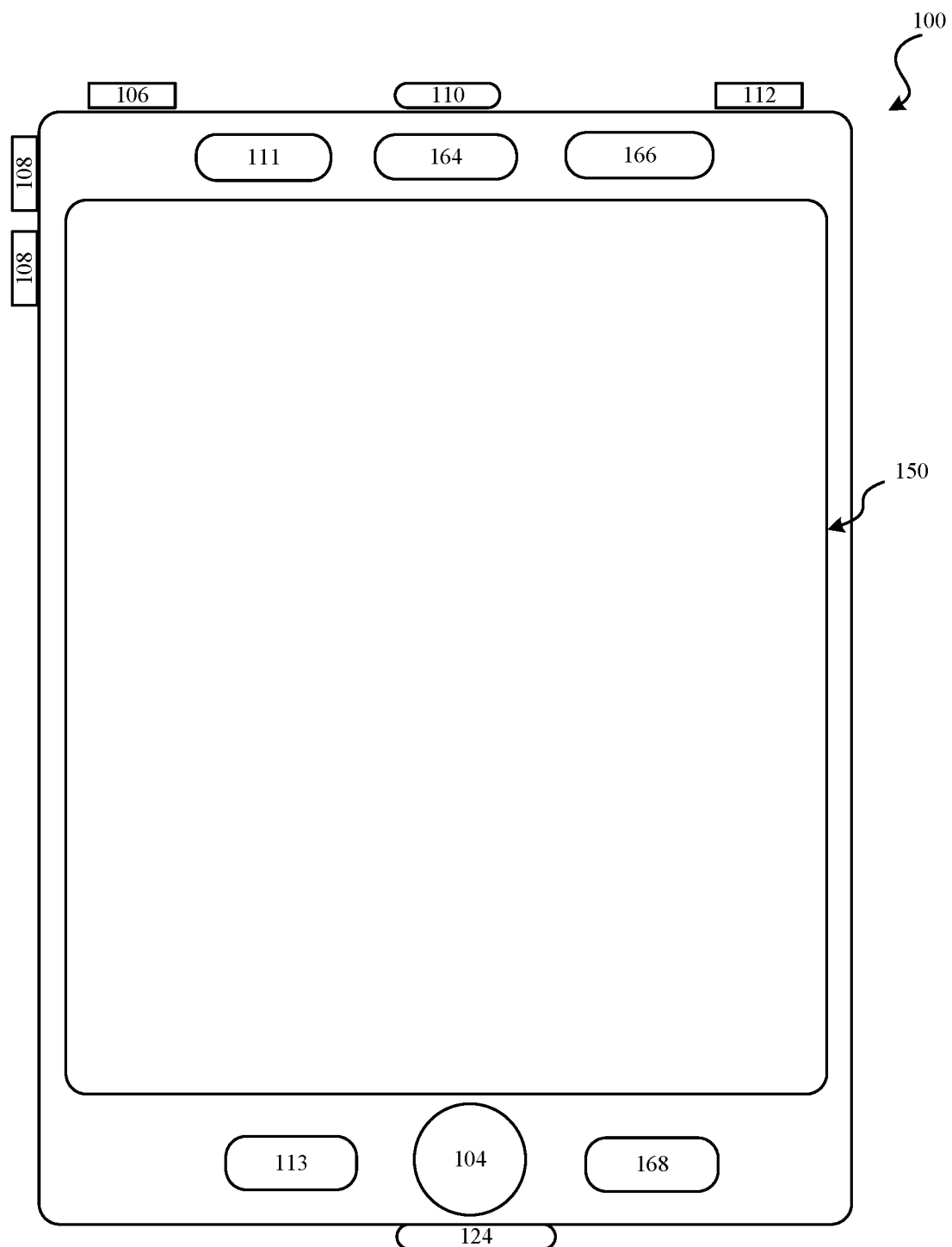
FIG. 1 is a high-level diagram of an electronic device, according to one or more embodiments.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to an amplifier circuit using chopper circuits at the input and output ports. The amplifier circuit includes a set of transistors for amplifying an input signal. At any given point in time during the operation of the amplifier circuit, a first subset of transistors is used for amplifying a positive end of a differential signal, and a second subset of transistors is used for amplifying a negative end of the differential signal. The chopper circuits may include a set of input chopper circuits and a set of output chopper circuits. Each output chopper circuit corresponds to one input chopper of the set of input choppers. Each input chopper circuit and its corresponding output chopper are controlled by control signals from a controller. Each input chopper circuit is coupled between the differential input of the amplifier circuit and a corresponding transistor pair from the set of transistors. Similarly, each output chopper circuit is coupled between the differential output of the amplifier circuit and a corresponding transistor pair from the set of transistors. Each input chopper circuit selectively connects each transistor of a transistor pair to a first input terminal or a second input terminal based on a value of the one or more control signals. Moreover, each output chopper circuit selectively connects each transistor of the transistor pair to a first output terminal or a second output terminal based on the value of the one or more control signals.

Exemplary Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

FIG. 1 is a high-level diagram of an electronic device 100, according to one or more embodiments. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. The device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. The device 100 may include components not shown in FIG. 1.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). Device 100 may include one or more current sense circuits described herein.

Example Amplifier Having Input and Output Chopper Circuits

Figure 2A:
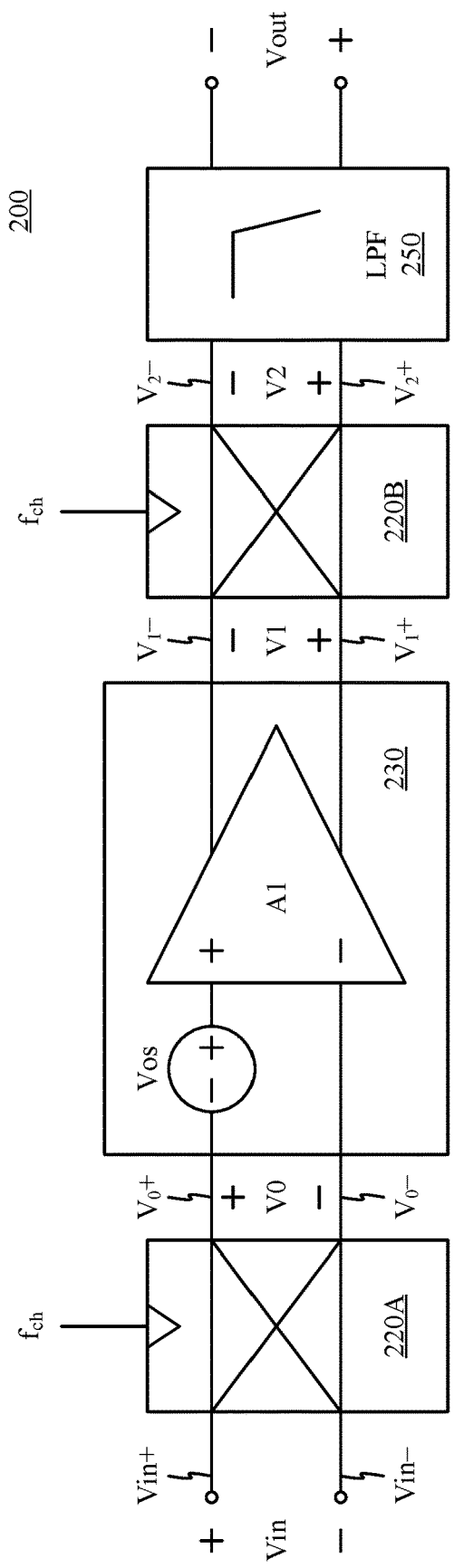
FIG. 2A is a circuit diagram of an amplifier circuit, according to one or more embodiments.

FIG. 2A is a circuit diagram of an amplifier circuit 200, according to one or more embodiments. The amplifier circuit 200 may include, among other components, a differential amplifier 230 having a gain A1, an input chopper circuit 220A and an output chopper circuit 2B. In some embodiments, the amplifier circuit 200 further includes a low pass filter 250. Moreover, due to imbalances and parasitic in the differential amplifier 230, the differential amplifier includes an offset Vos.

The input chopper circuit 220A receives an input voltage Vin and generates an alternating voltage $V_0$. The chopper circuit is controlled based on the control signal $f_{ch}$. The control signal $f_{ch}$ periodically alternates between a first value and a second value. When the control signal $f_{ch}$ has a first value, the input chopper circuit 220A connects a first input terminal Vin+ to a first output terminal $V_0+$ and connects a second input terminal Vin− to a second output terminal $V_0-$. As such, when the control signal $f_{ch}$ has the first value, the input chopper circuit 220A transfers a voltage at the first input to the first output and transfers a voltage at the second input to the second output. Moreover, when the control signal $f_{ch}$ has a second value, the input chopper circuit 220A connects the first input terminal Vin+ to the second output terminal $V_0-$ and connects the second input terminal Vin− to the first output terminal $V_0+$. As such, when the control signal $f_{ch}$ has the second value, the input chopper circuit 220A transfers a voltage at the first input to the second output and transfers a voltage at the second input to the first output. That is, when the control signal $f_{ch}$ has the second value, the input chopper circuit 220A inverts the polarity of the input voltage Vin.

The differential amplifier 230 has a gain A1 and an input offset Vos. The differential amplifier 230 receives the alternating voltage $V_0$ from the input chopper circuit 220A and generates an amplified voltage $V_1$. The differential amplifier 230 amplifies the alternating voltage $V_0$ based on the gain A1. Moreover, because of the imbalances and parasitics of the differential amplifier, the differential amplifier 230 adds an offset voltage Vos to the generated amplified alternating voltage $V_1$.

The output chopper circuit 220B receives the amplified alternating voltage $V_1$ generated by the differential amplifier 230 and generates a second voltage $V_2$. The output chopper 220B is also controlled based on the control signal $f_{ch}$. When the control signal $f_{ch}$ has the first value, the output chopper circuit 220B connects a first input terminal to a first output terminal $V_2-$ and connects a second input terminal $V_1+$ to a second output terminal $V_2+$. As such, when the control signal $f_{ch}$ has the first value, the output chopper circuit 220B transfers a voltage at the first input to the first output and transfers a voltage at the second input to the second output. Moreover, when the control signal $f_{ch}$ has the second value, the output chopper circuit 220B connects the first input terminal $V_1-$ to the second output terminal $V_2+$ and connects the second input terminal $V_1+$ to the first output terminal $V_2-$. As such, when the control signal $f_{ch}$ has the second value, the output chopper circuit 220B transfers a voltage at the first input to the second output and transfers a voltage at the second input to the first output. That is, when the control signal $f_{ch}$ has the second value, the output chopper circuit 220B inverts the polarity of the amplified alternating voltage $V_1$.

The low pass filter (LPF) 250 filters out high frequency components from the second voltage $V_2$ to generate the output voltage Vout. In some embodiments, the LPF 250 attenuates signal components that have a frequency larger than the frequency of the control signal $f_{ch}$.

Figure 2B:
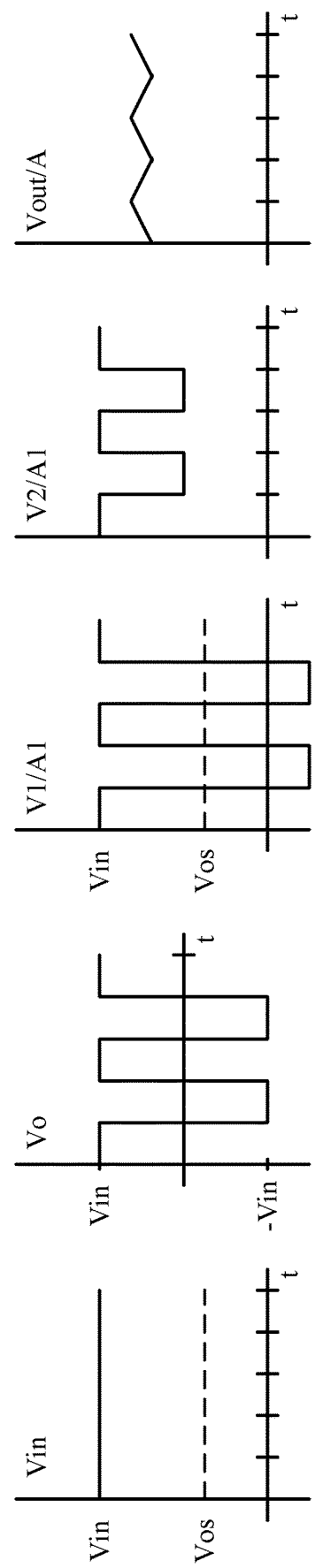
FIG. 2B illustrates time diagrams of signals in the amplifier circuit of FIG. 2A, according to one or more embodiments.

FIG. 2B illustrates time diagrams of signals in the amplifier circuit of FIG. 2A, according to one or more embodiments. FIG. 2B illustrates a first time diagram showing the input voltage Vin with respect to time, a second time diagram showing the alternating voltage $V_0$ with respect to time, a third time diagram showing the amplified alternating voltage $V_1$ with respect to time, a fourth time diagram showing the second voltage $V_2$ with respect to time, and a fifth time diagram showing the output voltage Vout with respect to time.

As shown in the first time diagram of FIG. 2B, the input voltage Vin is a constant voltage. Moreover, the alternating voltage $V_0$ at the output of the input chopper circuit 220 alternates between Vin and −Vin. The amplified alternating voltage $V_1$ is offset by the offset voltage Vos. Similarly, because of the offset voltage Vos, the second voltage $V_2$ has a periodic behavior. That is, because of the offset voltage, when the output chopper circuit 220B inverts the amplified alternating voltage, the amplitude of the inverted signal does not have the same amplitude as the portions when the first signal that are not inverted by the output chopper circuit 220B. Finally, the output voltage Vout retains the DC level of the second voltage $V_2$ but removes certain high frequency components.

Figure 2C:
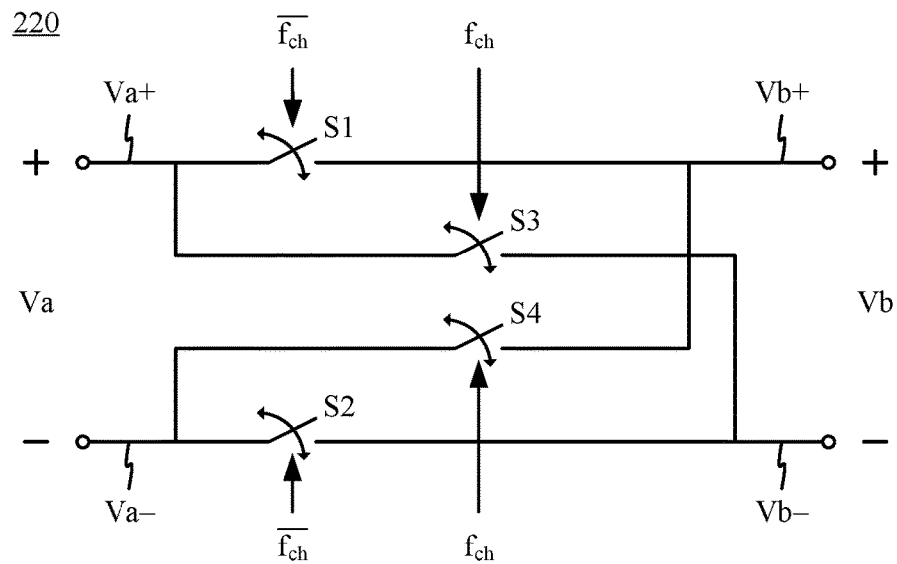
FIG. 2C is a circuit diagram illustrating a chopper circuit, according to one or more embodiments.

FIG. 2C is a circuit diagram illustrating a chopper circuit, according to one or more embodiments. The chopper circuit 220 includes four switches S1, S2, S3, and S4. The first switch S1 is coupled between the first input terminal Va+ and the first output terminal Vb+. The second switch S2 is coupled between the second input terminal Va− and the second output terminal Vb−. The third switch S3 is coupled between the first input terminal Va+ and the second output terminal Vb−. The fourth switch S4 is coupled between the second input terminal Va− and the first output terminal V+.

The third switch S3 and the fourth switch S4 are controlled by a control signal $f_{ch}$. The first switch S1 and the second switch S2 are controlled by an inverse of the control signal $\overline{f_{ch}}$. As such, when the control signal $f_{ch}$ is inactive, the first switch S1 and the second switch S2 are closed and the third switch S3 and the fourth switch S4 are opened, connecting the first input terminal Va+ to the first output terminal Vb+ and the second input terminal Va− to the second output terminal Vb−. Conversely, when the control signal is active, the third switch S3 and the fourth switch S4 are closed and the first switch S1 and the second switch S2 are opened, connecting the first input terminal Va+ to the second output terminal Vb− and the second input terminal Va− to the first output terminal Vb+.

The chopper circuit 220 may be split into to half chopper circuits. For example, the chopper circuit 220 may be split into two half input chopper circuits. A first half input chopper circuit includes the first switch S1 and the fourth switch S4, and a second half input chopper circuit includes the third switch S3 and the second switch S2. Each half input chopper circuit is configured to couple one of two input terminals to one output terminal based on the value of the control signal.

In another example, the chopper circuit 220 may be split into two half output chopper circuits. A first half output chopper circuit includes the first switch S1 and the third switch S3, and a second half input chopper circuit includes the fourth switch S4 and the second switch S2. Each half output chopper circuit is configured to couple one input terminals to one of two output terminals based on the value of the control signal.

Figure 2D:
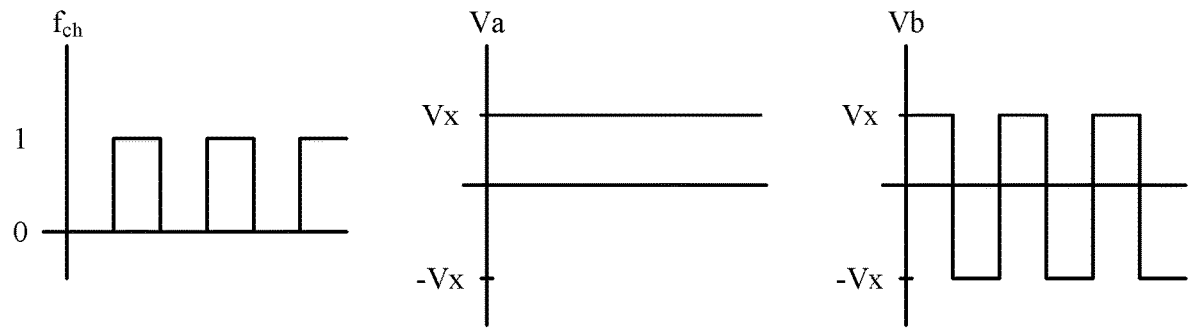
FIG. 2D illustrates time diagrams of signals in the chopper circuit of FIG. 2C when the input signal is constant, according to one or more embodiments.

FIG. 2D illustrates time diagrams of signals in the chopper circuit of FIG. 2C when the input signal Va is constant, according to one or more embodiments. When the input signal Va has a constant value Vx, the output signal Vb toggles between +Vx and −Vx each time the control signal toggles.

Figure 2E:
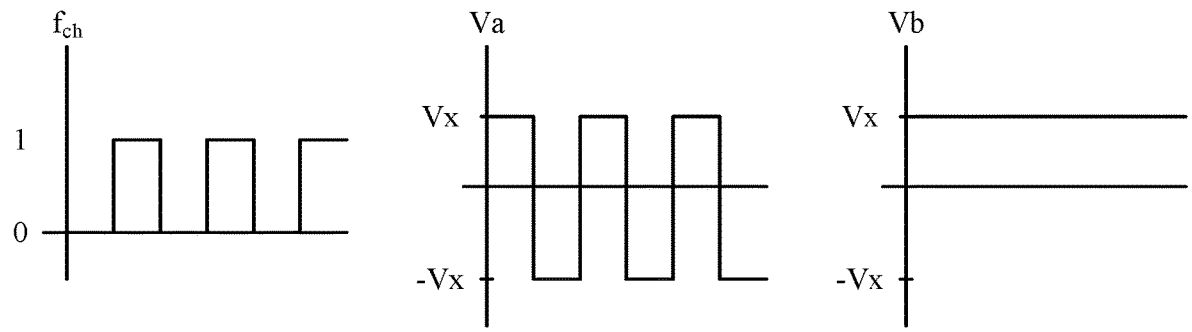
FIG. 2E illustrates time diagrams of signals in the chopper circuit of FIG. 2C when the input signal toggles between a first level and a second level, according to one or more embodiments.

FIG. 2E illustrates time diagrams of signals in the chopper circuit of FIG. 2C when the input signal Va toggles between a first level +Vx and a second level −Vx, according to one or more embodiments. In particular, the input signal toggles at the same time as the control signal $f_{ch}$. That is, when the control signal $f_{ch}$ has an inactive value, the input signal Va has a first level (e.g., +Vx), and when the control signal $f_{ch}$ has an active value, the input signal Va has a second level (e.g., −Vx), opposite to the first level. As such, when the control signal $f_{ch}$ has an active value, the input signal Va is inverted. Thus, the resulting output signal Vb has a constant level.

Chopper circuits can have large ripple at their output and may suffer from large spikes due to the periodic switching. As shown in FIG. 2B, an artifact that chopper circuits may introduce to the output of an amplifier circuit is the presence of a triangle waveform produced by a current output and the low pass filter (LPF) 250. The peak-to-peak amplitude of the ripple is proportional to the initial offset Vos of the differential amplifier 230. As a result, the chopping ripple can vary substantially from amplifier to amplifier and with time and temperature.

Example Amplifier Having Distributed Input and Output Chopper Circuits

Figure 3A:
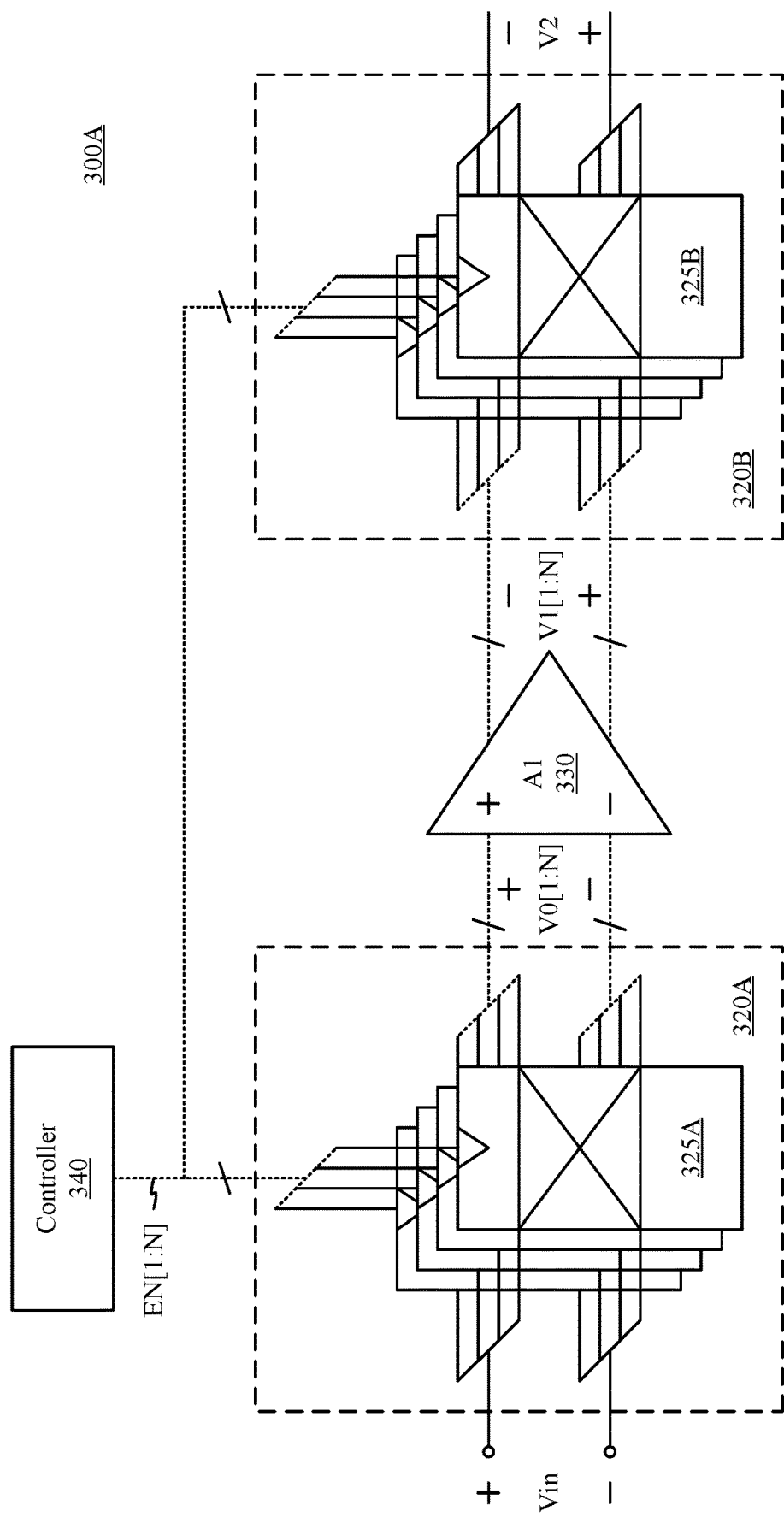
FIG. 3A is a block diagram of an amplifier circuit having distributed chopper circuits, according to one or more embodiments.

FIG. 3A is a block diagram of an amplifier circuit 300 having distributed chopper circuits, according to one or more embodiments. The amplifier circuit 300 includes a differential amplifier 330, a set of input chopper circuits 320A having multiple input chopper circuits 325A, and a set of output chopper circuits 320B having multiple output chopper circuits 325B. In the diagram of FIG. 3A, the dotted connections denote a parallel connection including multiple signals being routed in parallel.

The set of input chopper circuits 320A receives an input voltage Vin as an input and generates a set of alternating voltage $V_0[1:N]$ as an output. In the example of FIG. 3A, N alternating voltages $V_0[1]$ through $V_0[N]$ are generated. Moreover, the set of input chopper circuits 320A is controlled by a set of control signals EN[1:N].

The set of input chopper circuits 320A includes N input chopper circuits 325A. Each input chopper circuit 325A includes a first input and a second input. The first inputs of each input chopper circuit 325A are connected to each other, and the second inputs of each input chopper circuit 325A are connected to each other. Additionally, each input chopper circuit 325A in the set of input chopper circuits 320A is controlled by a corresponding control signal from the set of control signals EN[1:N] and generates a corresponding alternating voltage of the set of alternating voltages $V_0[1:N]$ based on the corresponding control signal.

The differential amplifier 330 receives the set of alternating voltage $V_0[1:N]$ and amplifies the set of alternating voltages $V_0[1:N]$ to generate a set of amplified alternating voltages $V_1[1:N]$. In the example of FIG. 3A, N alternating voltages $V_0[1]$ through $V_0[N]$ are received as an input and N amplified alternating voltages $V_1[1]$ through $V_1[N]$ are generated as an output.

The set of output chopper circuits 320B receives a set of amplified alternating voltages $V_1[1:N]$ as an input and generates a second voltage $V_2$ as an output. In the example of FIG. 3A, N amplified alternating voltages $V_1[1]$ through $V_1[N]$ are received as an input. Moreover, the set of output chopper circuits 320B is controlled by the set of control signals EN[1:N].

The set of output chopper circuits 320B includes N output chopper circuits 325B. Each output chopper circuit 325B includes a first input, a second input, a first output, and a second output. The first outputs of each output chopper circuit 325B are connected to each other, and the second outputs of each output chopper circuit 325B are connected to each other. Additionally, each output chopper circuit 325B in the set of output chopper circuits 320B is controlled by a corresponding control signal from the set of control signals EN[1:N].

The controller 340 generates the control signals EN[1:N] for controlling the input chopper circuits 325A and the output chopper circuits 325B. In some embodiments, the controller 340 further tests and analyzes the amplifier circuit 330 and generates the control signals EN[1:N] based on the analysis of the amplifier circuit 330. For instance, the controller 340 analyzes the threshold voltage of transistors used in the amplifier circuit 330 and generates the control signals EN[1:N] based on the threshold voltages of those transistors.

Figure 3B:
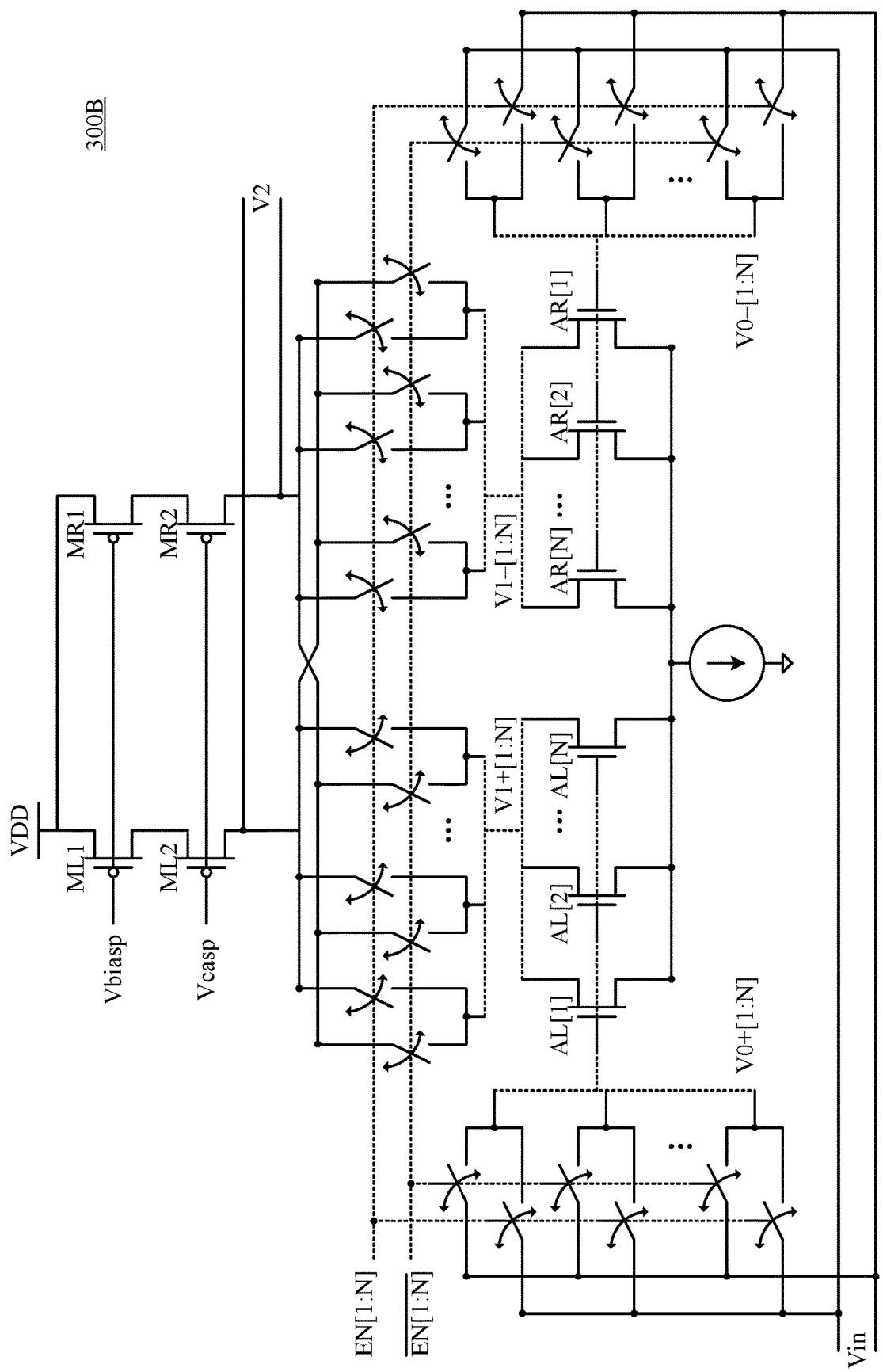
FIG. 3B is a circuit diagram of the amplifier circuit of FIG. 3A, according to one or more embodiments.

FIG. 3B is a circuit diagram of the amplifier circuit of FIG. 3A, according to one or more embodiments. The amplifier circuit 300B includes a set of left transistors AL[1:N] and a set of right transistors AR[1:N]. Each transistor in the set of left transistors AL[1:N] and set of right transistor AR[1:N] has a gate terminal that is connected to half of an input chopper circuit, and a drain terminal that is connected to half of an output chopper circuit. Each half input chopper circuit couples one of two input terminals to an output terminal. Each half output chopper circuit couples an input terminal to one of two output terminals.

The amplifier circuit 300B additionally includes transistors ML1, ML2, MR1, and MR2. Transistors ML1 and MR1 receive a first bias voltage Vbiasp. The first bias voltage Vbiasp sets a current level through transistors ML1 and MR1. Transistors ML2 and MR2 receive a second bias voltage Vcasp, and act as cascading transistors to increase the output impedance of transistors ML1 and MR1, increases the gain of amplifier circuit 300B.

Figure 3C:
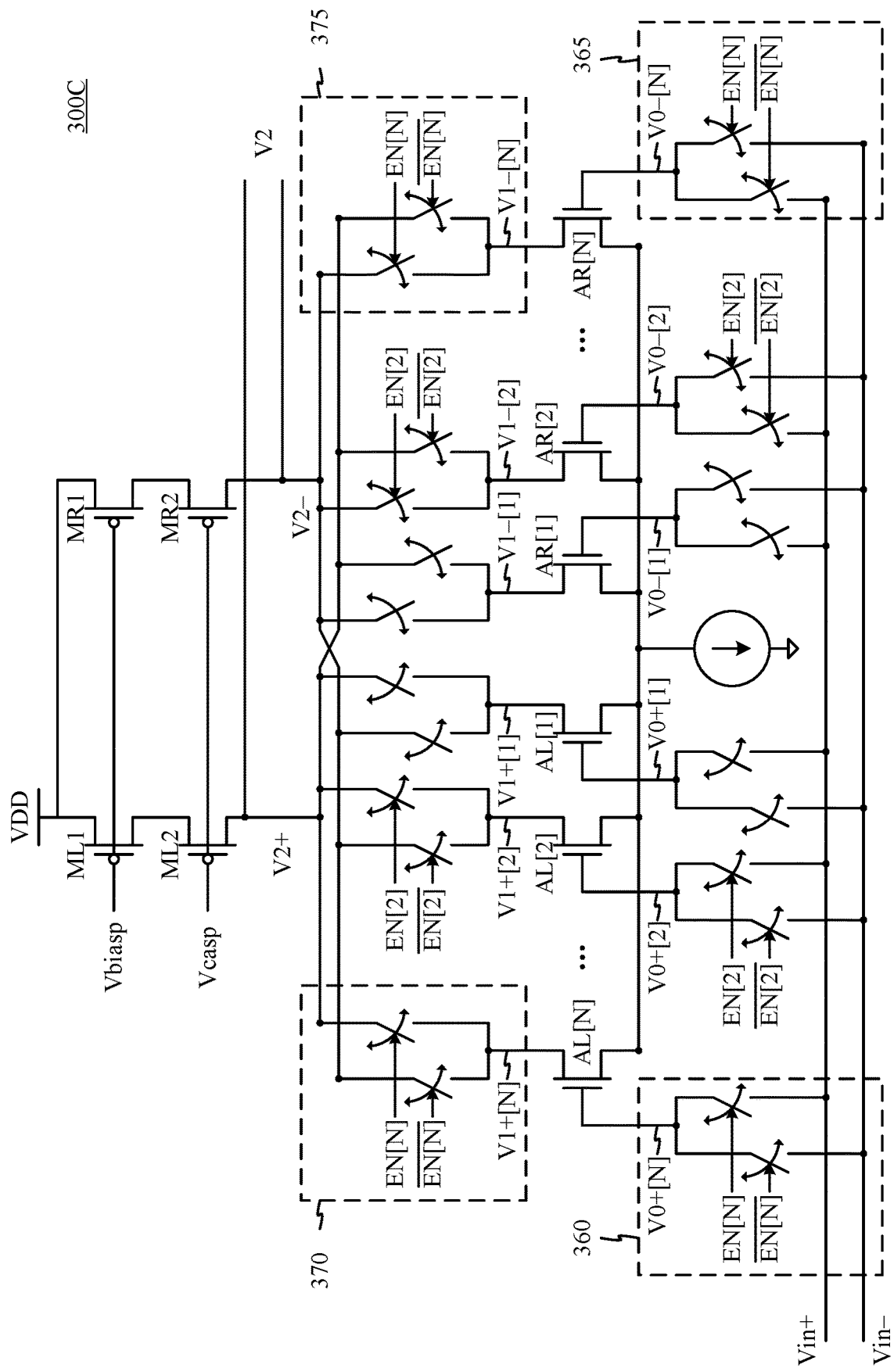
FIG. 3C is a detailed circuit diagram of the amplifier circuit of FIG. 3B, according to one or more embodiments.

FIG. 3C is a detailed circuit diagram of the amplifier circuit of FIG. 3B, according to one or more embodiments. As shown in FIG. 2C, each left transistor AL has a gate coupled to a half input chopper circuit 360, and a drain coupled to a half output chopper circuit 370. Each half input chopper circuit 360 has a first input switch receiving a corresponding control signal EN and a second input switch receiving an inverse of the control signal $\overline{EN}$. For example, the first input switch corresponding to the first left transistor AL[1] receives the first control signal EN[1] and the second input switch corresponding to the first left transistor AL[1] receives the inverse of the first control signal $\overline{EN[1]}$. Similarly, the first input switch corresponding to the N-th left transistor AL[N] receives the N-th control signal EN[N] and the second input switch corresponding to the N-th left transistor AL[N] receives the inverse of the N-th control signal $\overline{EN[N]}$.

The first input switch has a first terminal coupled to a positive terminal of an input voltage Vin+, and a second terminal coupled to the gate of the corresponding left transistor AL. Similarly, the second input switch has a first terminal coupled to a negative terminal of the input voltage Vin−, and a second terminal coupled to the gate of the left transistor AL. Since the second input switch receives an inverse of the signal received by the first input switch, only one input switch is active (i.e., closed) at a time. As such, depending on the value of the corresponding control signal EN, one of either the positive input voltage Vin+ or the negative voltage Vin− is transferred to the gate terminal of the left transistor AL.

Each half output chopper circuit 370 has a first output switch receiving a corresponding control signal EN and a second output switch receiving an inverse of the control signal $\overline{EN}$. For example, the first output switch corresponding to the first left transistor AL[1] receives the first control signal EN[1] and the second output switch corresponding to the first left transistor AL[1] receives the inverse of the first control signal $\overline{EN[1]}$. Similarly, the first output switch corresponding to the N-th left transistor AL[N] receives the N-th control signal EN[N] and the second output switch corresponding to the N-th left transistor AL[N] receives the inverse of the N-th control signal $\overline{EN[N]}$.

The first output switch has a first terminal coupled to the drain of the corresponding left transistor AL, and a second terminal coupled to a positive output terminal V2+. Similarly, the second output switch has a first terminal coupled to the drain of the corresponding left transistor AL, and a second terminal coupled to a negative output terminal V2−. Since the second output switch receives an inverse of the signal received by the first output switch, only one output switch is active (i.e., closed) at a time. As such, depending on the value of the corresponding control signal EN, the drain terminal of the left transistor AL is coupled to either the positive output terminal V2+ or the negative output terminal V2−.

Moreover, each right transistor AR has a gate coupled to half input chopper circuit 365, and a drain coupled to a half output chopper circuit 375. Each half input chopper circuit 365 has a first input switch receiving a corresponding control signal EN and a second input switch receiving an inverse of the control signal $\overline{EN}$. For example, the first input switch corresponding to the first right transistor AR[1] receives the first control signal EN[1] and the second input switch corresponding to the right left transistor AR[1] receives the inverse of the first control signal $\overline{EN[1]}$. Similarly, the first input switch corresponding to the N-th right transistor AR[N] receives the N-th control signal EN[N] and the second input switch corresponding to the N-th right transistor AR[N] receives the inverse of the N-th control signal $\overline{EN[N]}$.

The first input switch has a first terminal coupled to the negative terminal of the input voltage Vin−, and a second terminal coupled to the gate of the corresponding right transistor AR. Similarly, the second input switch has a first terminal coupled to the positive terminal of the input voltage Vin+, and a second terminal coupled to the gate of the right transistor AR. Since the second input switch receives an inverse of the signal received by the first input switch, only one input switch is active (i.e., closed) at a time. As such, depending on the value of the corresponding control signal EN, one of either the positive input voltage Vin+ or the negative voltage Vin− is transferred to the gate terminal of the left transistor AL.

Each half output chopper circuit 375 has a first output switch receiving a corresponding control signal EN and a second output switch receiving an inverse of the control signal $\overline{EN}$. For example, the first output switch corresponding to the first right transistor AR[1] receives the first control signal EN[1] and the second output switch corresponding to the first right transistor AR[1] receives the inverse of the first control signal $\overline{EN[1]}$. Similarly, the first output switch corresponding to the N-th right transistor AR[N] receives the N-th control signal EN[N] and the second output switch corresponding to the N-th right transistor AR[N] receives the inverse of the N-th control signal $\overline{EN[N]}$.

The first output switch has a first terminal coupled to the drain of the corresponding left transistor AL, and a second terminal coupled to the negative output terminal V2−. Similarly, the second output switch has a first terminal coupled to the drain of the corresponding left transistor AL, and a second terminal coupled to the positive output terminal V2+. Since the second output switch receives an inverse of the signal received by the first output switch, only one output switch is active (i.e., closed) at a time. As such, depending on the value of the corresponding control signal EN, the drain terminal of the left transistor AL is coupled to either the positive output terminal V2+ or the negative output terminal V2−.

The combination of a half input chopper circuit 360 corresponding to a left transistor AL and a half input chopper circuit 365 corresponding to a right transistor AR form a full input chopper circuit 220A. For example, the combination of the half input chopper circuit 360 of a k-th left transistor AL[k] and the half input chopper circuit 365 of the k-th right transistor AR[k] form a full input chopper circuit 220A. As such, the first switch of the half input chopper circuit 360 of a k-th left transistor AL[k] and the first switch of the half input chopper circuit 365 of the k-th right transistor AR[k] receive the same control signal EN[k]. Similarly, the second switch of the half input chopper circuit 360 of a k-th left transistor AL[k] and the second switch of the half input chopper circuit 365 of the k-th right transistor AR[k] receive the same inverse control signal $\overline{EN[k]}$.

Additionally, the combination of a half output chopper circuit 370 corresponding to a left transistor AL and a half output chopper circuit 375 corresponding to a right transistor AR form a full output chopper circuit 220B. For example, the combination of the half output chopper circuit 370 of the k-th left transistor AL[k] and the half output chopper circuit 375 of the k-th right transistor AR[k] form a full output chopper circuit 220B. As such, the first switch of the half output chopper circuit 370 of a k-th left transistor AL[k] and the first switch of the half output chopper circuit 375 of the k-th right transistor AR[k] receive the same control signal EN[k]. Similarly, the second switch of the half output chopper circuit 370 of a k-th left transistor AL[k] and the second switch of the half output chopper circuit 375 of the k-th right transistor AR[k] receive the same inverse control signal $\overline{EN[k]}$.

Figure 3D:
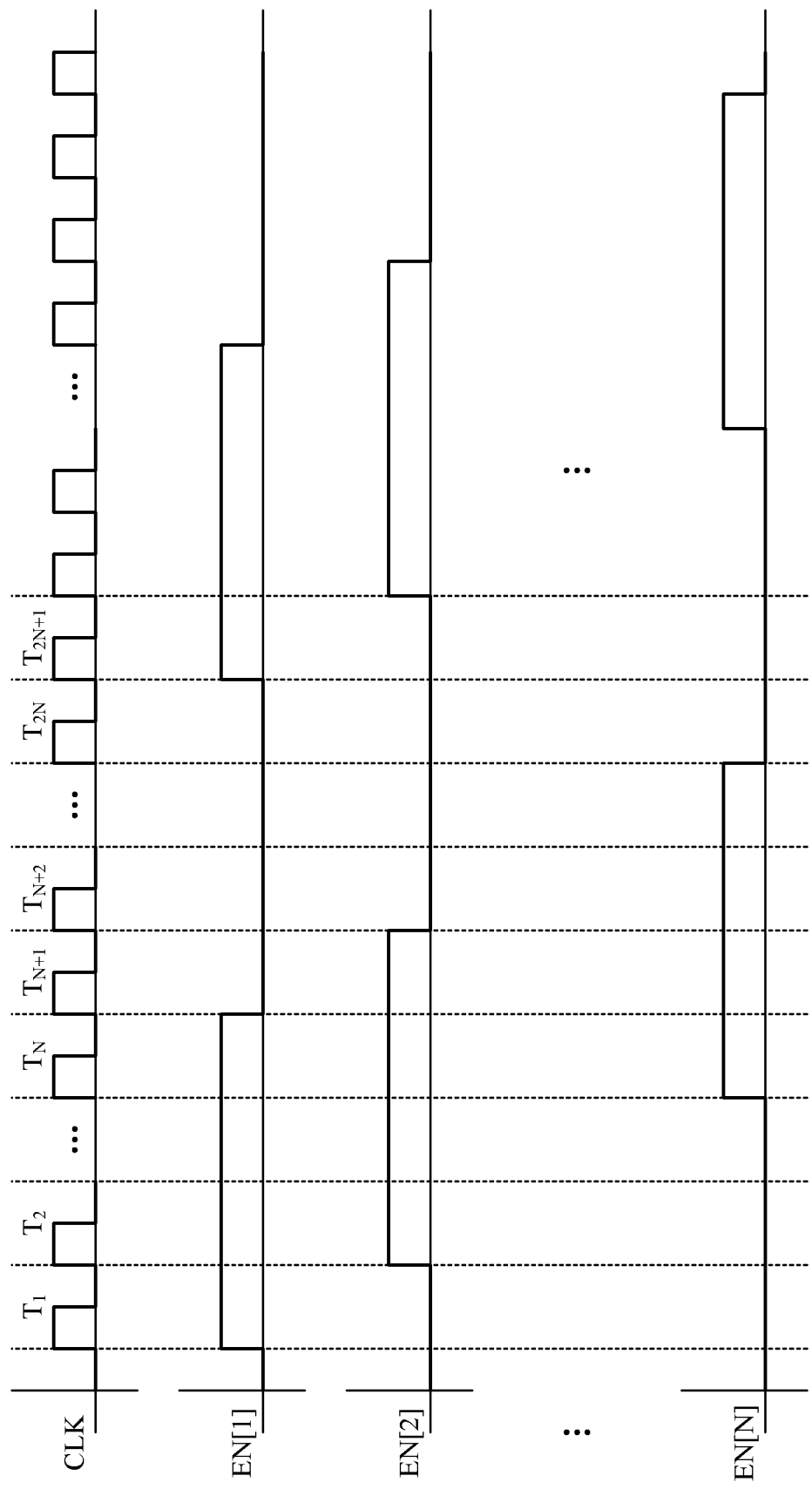
FIG. 3D is a timing diagram for the control signals for controlling the half input chopper circuits and the half output chopper circuits of the amplifier circuit of FIG. 3C, according to one or more embodiments.

FIG. 3D is a timing diagram for the control signals EN[1:N] for controlling the half input chopper circuits and the half output chopper circuits of the amplifier circuit of FIG. 3C, according to one or more embodiments. The timing diagram includes a clock signal CLK periodically transitioning between a first level and a second level. Moreover, the timing diagram includes control signals that toggle between an inactive level and an active level every N clock cycles.

The first control signal EN[1] is asserted or switched to an active level during the first cycle $T_1$ and stays asserted for N clock cycles (i.e., between cycle $T_1$ and cycle $T_N$). The first control signal EN[1] is then switched to an inactive level at cycle $T_{N+1}$ and stays at the inactive level until cycle $T_{2N}$ (N clock cycles). As such, between cycle $T_1$ and cycle $T_N$, the half input chopper circuit 360 of the first left transistor AL[1] couples the gate of the first left transistor AL[1] to the positive terminal of the input voltage Vin+, the half output chopper circuit 370 of the first left transistor AL[1] couples the drain of the first left transistor AL[1] to the positive output terminal V2+, the half input chopper circuit 365 of the first right transistor AR[1] couples the gate of the first right transistor AR[1] to the negative terminal of the input voltage Vin−, and the half output chopper circuit 375 of the first right transistor AR[1] couples the drain of the first right transistor AR[1] to the negative output terminal V2−. Moreover, between cycle $T_{N+1}$ and cycle $T_{2N}$, the half input chopper circuit 360 of the first left transistor AL[1] couples the gate of the first left transistor AL[1] to the negative terminal of the input voltage Vin−, the half output chopper circuit 370 of the first left transistor AL[1] couples the drain of the first left transistor AL[1] to the negative output terminal V2−, the half input chopper circuit 365 of the first right transistor AR[1] couples the gate of the first right transistor AR[1] to the positive terminal of the input voltage Vin+, and the half output chopper circuit 375 of the first right transistor AR[1] couples the drain of the first right transistor AR[1] to the positive output terminal V2+.

The second control signal EN[2] is asserted or switched to the active level during the second cycle $T_2$ and stays asserted for N clock cycles (i.e., between cycle $T_2$ and cycle $T_{N+1}$). The second control signal EN[1] is then switched to an inactive level at cycle $T_{N+2}$ and stays at the inactive level until cycle $T_{2N+1}$ (N clock cycles). As such, between cycle $T_2$ and cycle $T_{N+1}$, the half input chopper circuit 360 of the second left transistor AL[2] couples the gate of the second left transistor AL[2] to the positive terminal of the input voltage Vin+, the half output chopper circuit 370 of the second left transistor AL[2] couples the drain of the second left transistor AL[2] to the positive output terminal V2+, the half input chopper circuit 365 of the second right transistor AR[2] couples the gate of the second right transistor AR[2] to the negative terminal of the input voltage Vin−, and the half output chopper circuit 375 of the second right transistor AR[2] couples the drain of the second right transistor AR[2] to the negative output terminal V2−. Moreover, during cycle T1 and between cycle $T_{N+2}$ and cycle $T_{2N+1}$, the half input chopper circuit 360 of the second left transistor AL[2] couples the gate of the second left transistor AL[2] to the negative terminal of the input voltage Vin−, the half output chopper circuit 370 of the second left transistor AL[2] couples the drain of the second left transistor AL[2] to the negative output terminal V2−, the half input chopper circuit 365 of the second right transistor AR[2] couples the gate of the second right transistor AR[2] to the positive terminal of the input voltage Vin+, and the half output chopper circuit 375 of the second right transistor AR[2] couples the drain of the second right transistor AR[2] to the positive output terminal V2+.

Figure 3E:
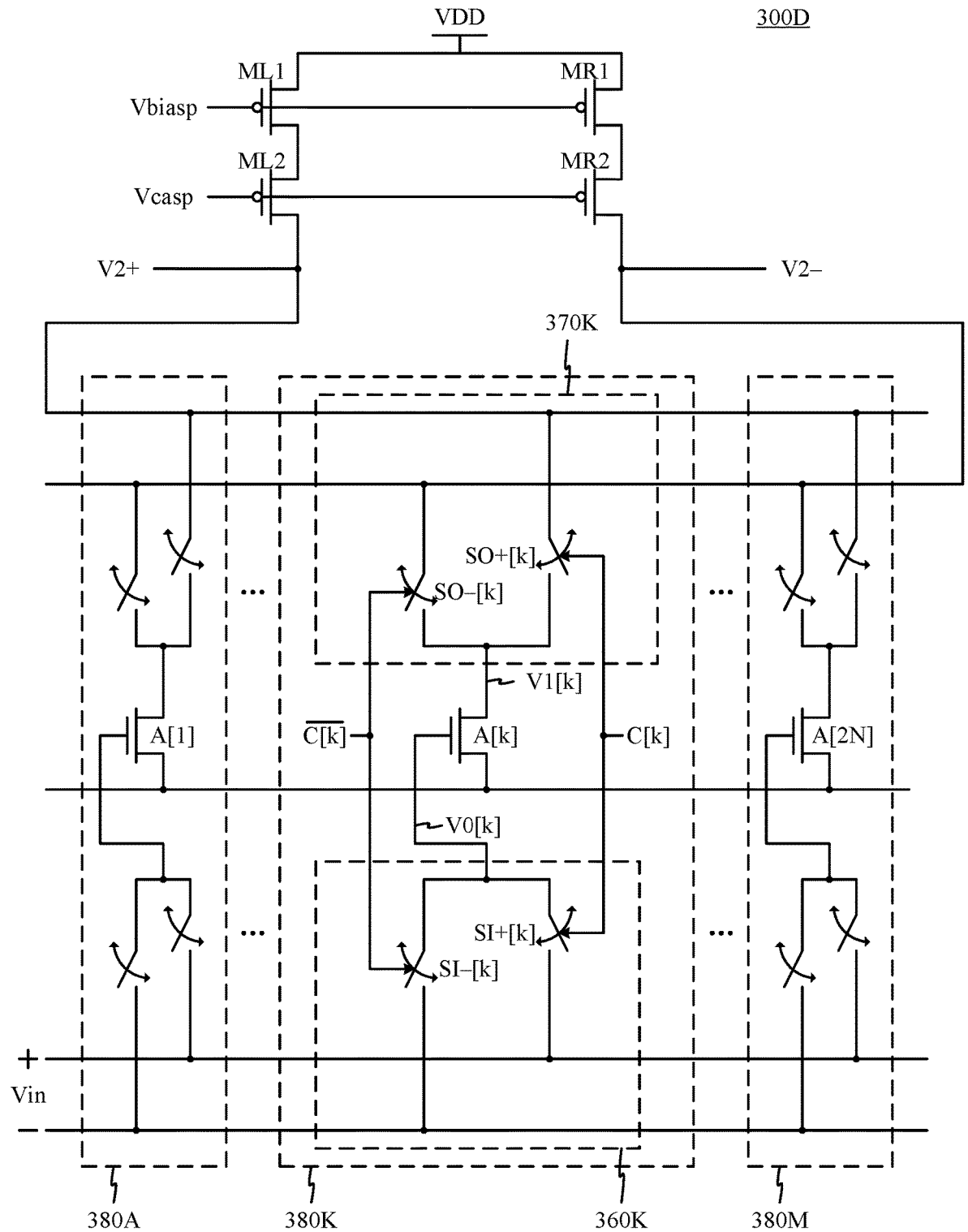
FIG. 3E is a circuit diagram of the amplifier circuit of FIG. 3A with configurable transistors, according to one or more embodiments.

FIG. 3E is a circuit diagram of the amplifier circuit of FIG. 3A with configurable transistors, according to one or more embodiments. Since each left transistor AL and each right transistor AR are connected to both positive and negative input terminals, as well as both positive and negative output terminals through various switches, the amplifier circuit 300 can be implemented using a set of fingers 380 that can be configured as a left transistor AL or a right transistor AR depending on the control signal EN provided to the finger 380.

As such, the amplifier circuit 300D includes 2N fingers 380 that can be configured to behave as a left transistor AL or a right transistor AR based on the control signal C provided to the finger. In particular, the controller 340 generates control signals C[1:2N] to configure N fingers to behave as left transistors AL[1:N] and N fingers to behave as right transistors AR[1:N].

Each finger 380 includes a transistor A, a half input chopper circuit 360, and a half output chopper circuit 370. For example, FIG. 3E illustrates a finger 380K having a transistor A[k], a half input chopper circuit 360K, and a half output chopper circuit 370K. Moreover, each finger receives a control signal C and a corresponding inverse control signal $\overline{C}$ for controlling the half input chopper circuit 360 and the half output chopper circuit 370.

The half input chopper circuit 360 includes a first input switch SI+ receiving the control signal C, and a second input switch SI− receiving the inverse control signal $\overline{C}$. The first input switch SI+ is connected between the positive input terminal Vin+ and the gate of the transistor A. The second input switch SI− is connected between the negative input terminal Vin− and the gate of the transistor A.

The half output chopper circuit 370 includes a first output switch SO+ receiving the control signal C, and a second output switch SO− receiving the inverse control signal $\overline{C}$. The first output switch SO+ is connected between the positive output terminal $V_2$+ and the drain of the transistor A. The second output switch SO− is connected between the negative output terminal $V_2$− and the drain of the transistor A.

When the control signal C[k] for the k-th finger configures the first input switch SI+[k] and the first output switch SO+[k] to be closed during a first portion of a cycle and opened during a second portion of the cycle, the control signal C[k] configures the k-th finger to behave as a left transistor. Conversely, when the control signal C[k] for the k-th finger configures the second input switch SI−[k] and the second output switch SO−[k] to be closed during the first portion of a cycle and opened during the second portion of the cycle, the control signal C[k] configures the k-th finger to behave as a right transistor.

As such, the controller 340 is able to select which fingers to configure as left transistors and which fingers to configure as right transistors to reduce the offset between the left side of the differential amplifier and the right side of the differential amplifier.

Figure 3F:
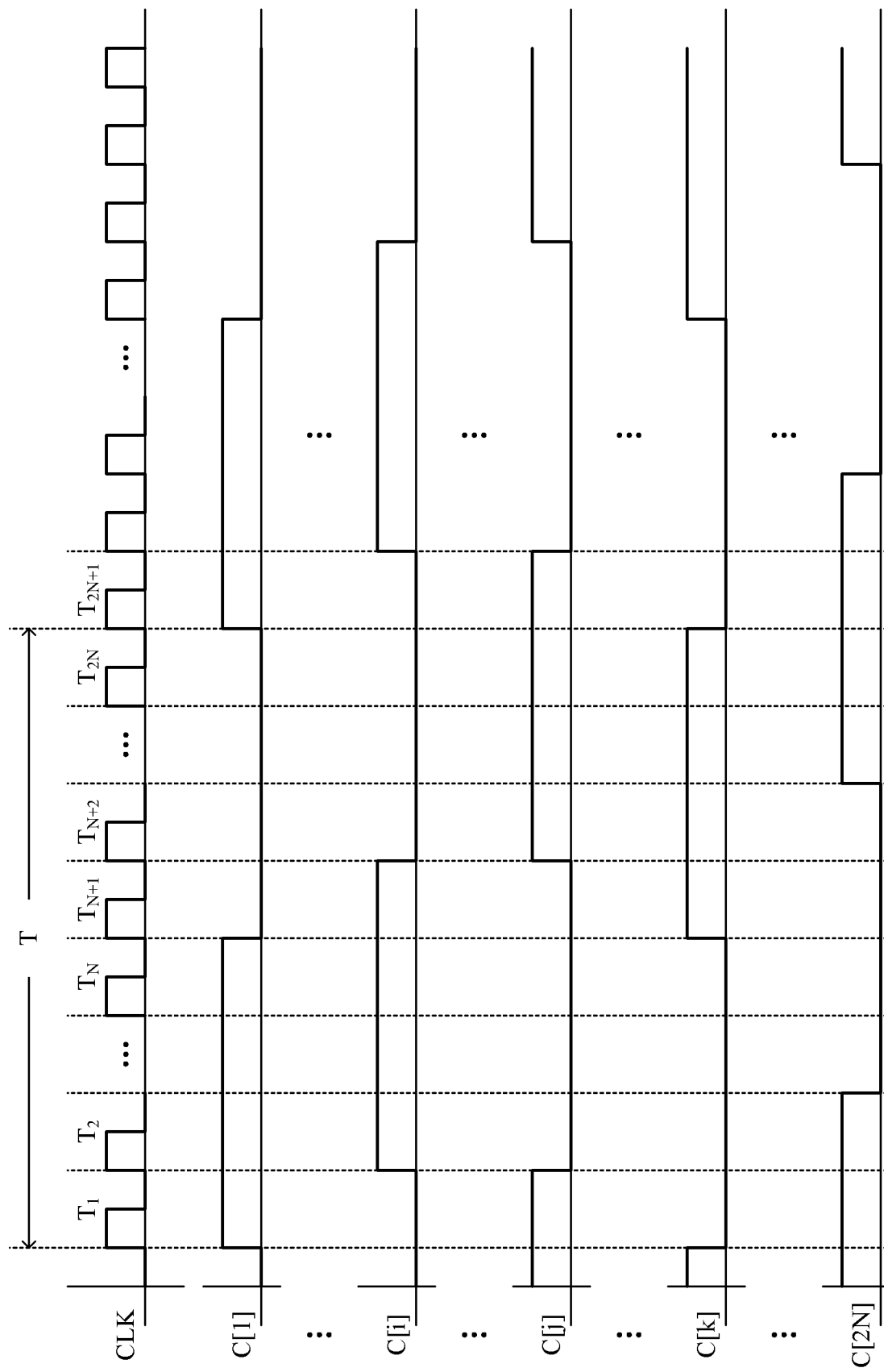
FIG. 3F is a timing diagram for the control signals for controlling each finger of the amplifier circuit of FIG. 3E, according to one or more embodiments.

FIG. 3F is a timing diagram for the control signals C[1:2N] generated by controller 340 for controlling each finger 380 of the amplifier circuit of FIG. 3E, according to one or more embodiments. The timing diagram includes a clock signal CLK periodically transitioning between a first level and a second level. Moreover, the timing diagram includes control signals that toggle between an inactive level and an active level every N clock cycles.

The control signals C[1:2N] include a first subset of signals that control a first subset of fingers 380 to behave as left transistors AL, and a second subset of signals that control a second subset of fingers 380 to behave as right transistors AR. For example, in the timing diagram of FIG. 3F, control signal C[1] and C[i] control respective fingers to behave as left transistors AL, and control signals C[j] and C[k] control respective fingers to behave as right transistors AR.

The first subset of signals that control the first subset of fingers 380 to behave as left transistors AL transition from a first level to a second level within the first half ($T_1$ through $T_N$) of a control period T, and transition from the second level to the first level within the second half ($T_{N+1}$ through $T_{2N}$) of the control period T. For example, control signal C[1] transitions from the first level (LO) to the second level (HI) at the beginning of cycle $T_1$ and transitions from the second level (HI) to the first level (LO) at the beginning of cycle $T_{N+1}$, and control signal C[i] transitions from the first level (LO) to the second level (HI) at the beginning of cycle $T_2$ and transitions from the second level (HI) to the first level (LO) at the beginning of cycle $T_{N+2}$. Moreover, the second subset of signals that control the second subset of fingers 380 to behave as right transistors AR transition from the second level to the first level within the first half of the control period T, and transition from the first level to the second level within the second half of the control period T. For example, control signal C[j] transitions from the second level (HI) to the first level (LO) at the beginning of cycle $T_2$ and transitions from the first level (LO) to the second level (HI) at the beginning of cycle $T_{N+2}$, and control signal C[k] transitions from the second level (HI) to the first level (LO) at the beginning of cycle $T_1$ and transitions from the first level (LO) to the second level (HI) at the beginning of cycle $T_{N+1}$.

Additionally, each control signal in the first subset of control signals that control the first subset of fingers 380 has a corresponding control signal in the second subset of control signals that control the second subset of fingers 380. For example, in the timing diagram of FIG. 3F, control signal C[1] has a corresponding control signal C[k], and control signal C[i] has a corresponding control signal C[j]. When one control signal in the first subset of control signals transitions from the first level to the second level, the corresponding signal in the second subset of control signals transitions from the second level to the first level. Additionally, when the control signal in the first subset of control signals transitions from the second level to the first level, the corresponding signal in the second subset of control signals transitions form the first level to the second level.

In some embodiments, the control signals are generated such that during any cycle during the operation of the amplifier circuit 300, only one control signal transitions from the first level to the second level, and only one control signal transitions from the second level to the first level. Moreover, the control signals are generated such that during any cycle during the operation of the amplifier circuit 300, one half of the control signals (N control signals) are at the first level and the other half of the control signals (N control signals) are at the second level. As such, during any cycle during the operation of the amplifier circuit 300, one half of the fingers 380 are amplifying the positive input voltage Vin+ and the other half of the fingers 380 are amplifying the negative input voltage Vin−.

By controlling the order in which the control signals C[1:2N] switch between the first level and the second level, the controller 340 is able to pair two fingers 380 such that one behaves as a left transistor AL and the other behaves as a right transistor AR. This allows the control circuit 340 to reduce an amount of offset introduced by the amplifier circuit 300D.

Figure 4:
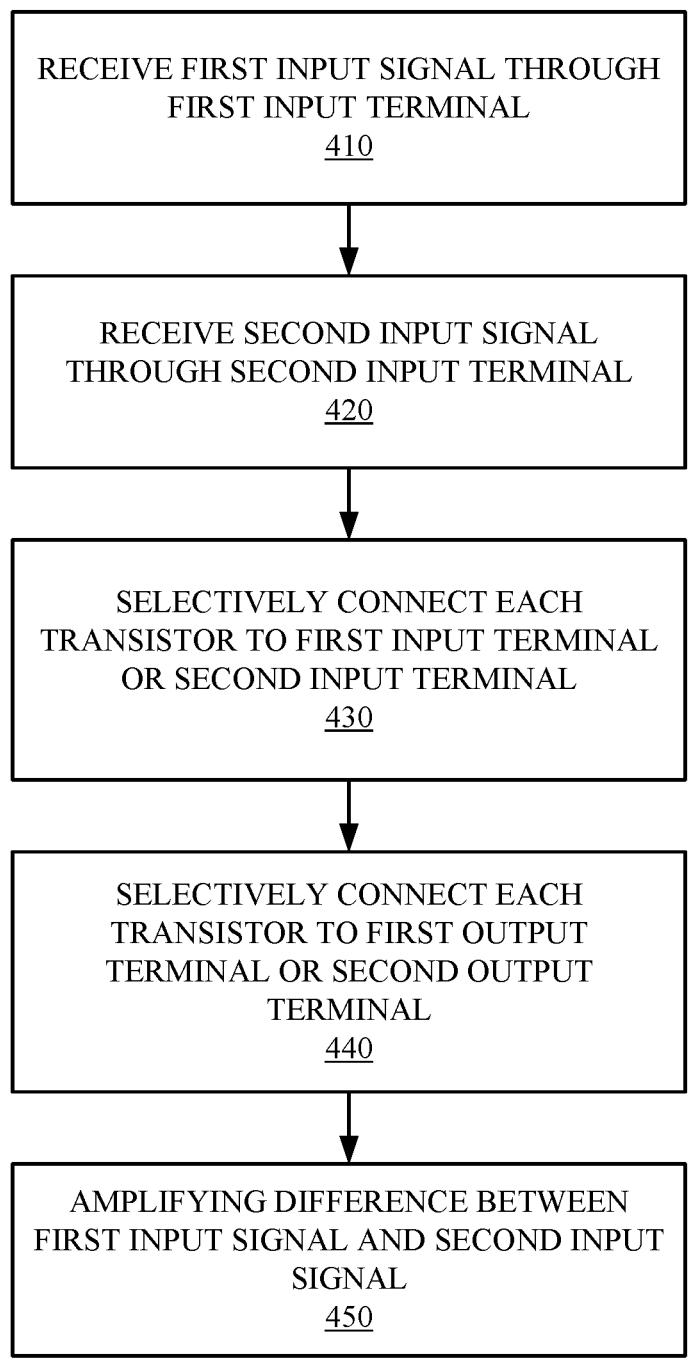
FIG. 4 is a flowchart illustrating a process for operating an amplifier circuit, according to one or more embodiments.

FIG. 4 is a flowchart illustrating a process for operating an amplifier circuit, according to one or more embodiments. The amplifier circuit 300 receives 410 a first input signal Vin+ through a first input terminal, and receives 320 a second input signal Vin− through a second input terminal. For example, the first input signal Vin+ and the second input signal Vin− ends of a differential signal Vin.

A set of input chopper circuits 320A selectively connects 430 each transistor of a set of transistors to either the first input terminal or the second input terminal based on the value of a control signal. Moreover, a set of output chopper circuits 320B selectively connects 440 each transistor of the set of transistors to a first output terminal or a second output terminal based on the value of the control signal. For example, if the control signal has a first value, a first input chopper circuit 325A connects the gate of a first left transistor AL[1] to the first input terminal and connects the gate of a first right transistor AR[1] to the second input terminal. Additionally, a first output chopper circuit 325B connects the drain of the first left transistor AR[1] to the first output terminal and connects the drain of the first right transistor AR[1] to the second output terminal. Alternatively, if the control signal has a second value, the first input chopper circuit 325A connects the gate of the first left transistor AL[1] to the second input terminal and connects the gate of the first right transistor AR[1] to the first input terminal. Additionally, the first output chopper circuit 325B connects the drain of the first left transistor AR[1] to the second output terminal and connects the drain of the first right transistor AR[1] to the first output terminal.

The amplifier circuit amplifies 450 the difference between the first input signal and the second input signal. That is, the set of transistors of the amplifier circuit 300 generates an amplified signal based on the received input signal. In some embodiments, the amplifier circuit amplifies 450 the difference between the first input signal and the second input signal. For example, if the amplifier circuit receives signals Vin+ and Vin− having a difference of [(Vin+)−(Vin−)], the amplifier circuit generates signals Vout+ and Vout− having a difference of $$[(Vout+)-(Vout-)]=[A(Vin+)-A(Vin-)]=A[(Vin+)-(Vin-)]$$

In particular, the operation of the amplifier circuit 300 is divided into a set of cycles. During a first cycle, a first transistor AL[1] of a first transistor pair is connected to the first input terminal and the first output terminal, and a second transistor AR[1] of the first transistor pair is connected to the second input terminal and the second output terminal. Moreover, during the first cycle, a first transistor AL[2] of a second transistor pair is connected to the first input terminal and the first output terminal, and a second transistor AR[2] of the second transistor pair is connected to the second input terminal and the second output terminal. That is, during the first cycle, the first control signal EN[1] has the first value (e.g., LO) and the second control signal EN[2] has the first value (e.g., LO). As such, the first input signal Vin+ is provided to the first transistor AL[1] of the first transistor pair and the first transistor AL[2] of the second transistor pair, and the second input signal Vin− is provided to the second transistor AR[1] of the first transistor pair and the second transistor AR[2] of the second transistor pair.

During a second cycle, the first transistor AL[1] of the first transistor pair is connected to the second input terminal and the second output terminal, and the second transistor AR[1] of the first transistor pair is connected to the first input terminal and the first output terminal. Moreover, during the second cycle, the first transistor AL[2] of the second transistor pair is connected to the first input terminal and the first output terminal, and the second transistor AR[2] of the second transistor pair is connected to the second input terminal and the second output terminal. That is, during the first cycle, the first control signal EN[1] has the second value (e.g., HI) and the second control signal EN[2] has the first value (e.g., LO). As such, the first input signal Vin+ is provided to the second transistor AR[1] of the first transistor pair and the first transistor AL[2] of the second transistor pair, and the second input signal Vin− is provided to the first transistor AL[1] of the first transistor pair and the second transistor AR[2] of the second transistor pair.

During a third cycle, the first transistor AL[1] of the first transistor pair is connected to the second input terminal and the second output terminal, and the second transistor AR[1] of the first transistor pair is connected to the first input terminal and the first output terminal. Moreover, during the third cycle, the first transistor AL[2] of the second transistor pair is connected to the second input terminal and the second output terminal, and the second transistor AR[2] of the second transistor pair is connected to the first input terminal and the first output terminal. That is, during the first cycle, the first control signal EN[1] has the second value (e.g., HI) and the second control signal EN[2] has the second value (e.g., HI). As such, the first input signal Vin+ is provided to the second transistor AR[1] of the first transistor pair and the second transistor AR[2] of the second transistor pair, and the second input signal Vin− is provided to the first transistor AL[1] of the first transistor pair and the first transistor AL[1] of the second transistor pair.

During a fourth cycle, the first transistor AL[1] of the first transistor pair is connected to the first input terminal and the first output terminal, and the second transistor AR[1] of the first transistor pair is connected to the second input terminal and the second output terminal. Moreover, during the third cycle, the first transistor AL[2] of the second transistor pair is connected to the second input terminal and the second output terminal, and the second transistor AR[2] of the second transistor pair is connected to the first input terminal and the first output terminal. That is, during the first cycle, the first control signal EN[1] has the first value (e.g., LO) and the second control signal EN[2] has the second value (e.g., HI). As such, the first input signal Vin+ is provided to the first transistor AL[1] of the first transistor pair and the second transistor AR[2] of the second transistor pair, and the second input signal Vin− is provided to the second transistor AR[1] of the first transistor pair and the first transistor AL[2] of the second transistor pair.

Amplifier Cell Having Distributed Input and Output Chopper Circuits

Figure 5A:
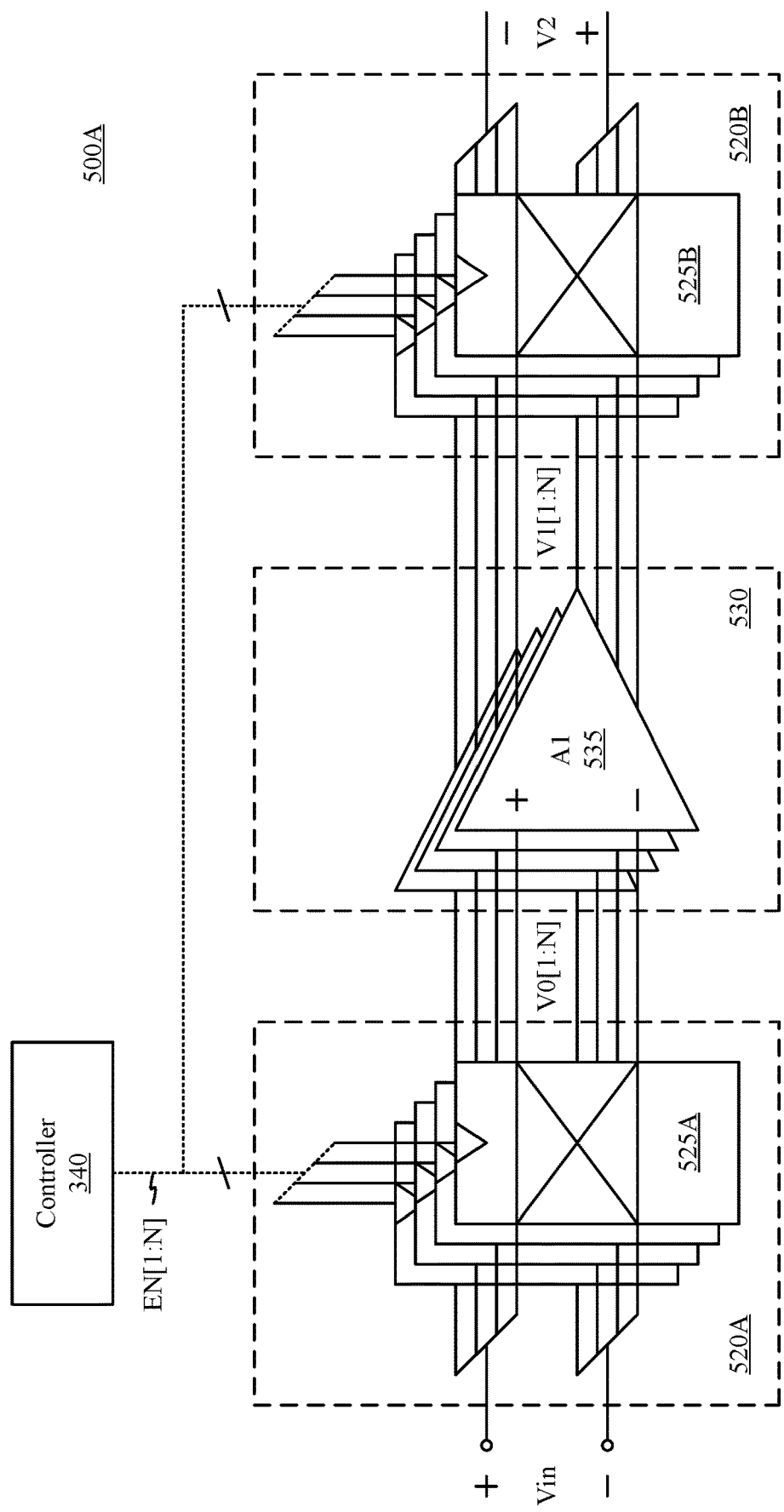
FIG. 5A is a block diagram of an amplifier circuit having distributed chopper circuits using amplifier cells, according to one or more embodiments.

FIG. 5A is a block diagram of an amplifier circuit having distributed chopper circuits using amplifier cells, according to one or more embodiments. The amplifier circuit 500 includes a set of differential amplifiers 530 having multiple differential amplifiers 535, a set of input chopper circuits 520A having multiple input chopper circuits 525A, and a set of output chopper circuits 520B having multiple output chopper circuits 525B.

Each input chopper circuit 525A from the set of input chopper circuits 520A is coupled to a corresponding differential amplifier 535 of the set of differential amplifiers 530. Additionally, each differential amplifier 535 of the set of differential amplifiers 530 is coupled to a corresponding output chopper circuit 525B of the set of output chopper circuits 520B. As such, the amplifier circuit 500 is implemented using a set of amplifier cells, each cell including an input chopper circuit 525A, a differential amplifier 535, and an output chopper circuit 525B.

The set of input chopper circuits 520A receives an input voltage Vin as an input and generates a set of alternating voltage $V_0[1:N]$ as an output. In the example of FIG. 5A, N alternating voltages $V_0[1]$ through $V_0[N]$ are generated. Moreover, the set of input chopper circuits 520A is controlled by a set of control signals EN[1:N].

The set of input chopper circuits 520A includes N input chopper circuits 525A. Each input chopper circuit 525A includes a first input and a second input. The first inputs of each input chopper circuit 525A are connected to each other, and the second inputs of each input chopper circuit 525A are connected to each other. Additionally, each input chopper circuit 525A in the set of input chopper circuits 520A is controlled by a corresponding control signal from the set of control signals EN[1:N] and generates a corresponding alternating voltage of the set of alternating voltages $V_0[1:N]$ based on the corresponding control signal.

The set of differential amplifiers 530 receives the set of alternating voltage $V_0[1:N]$ and amplifies the set of alternating voltages $V_0[1:N]$ to generate a set of amplified alternating voltages $V_1[1:N]$. In the example of FIG. 5A, N alternating voltages $V_0[1]$ through $V_0[N]$ are received as an input and N amplified alternating voltages $V_0[1]$ through $V_0[N]$ are generated as an output. Each alternative voltage is provided to one differential amplifier of the set of differential amplifiers 530. Each differential amplifier then amplifies the corresponding alternative voltage $V_0$ to generate a corresponding amplified alternating voltage $V_1$ from the set of amplified alternating voltages $V_1[1:N]$.

The set of output chopper circuits 520B receives the set of amplified alternating voltages $V_1[1:N]$ as an input and generates a second voltage $V_2$ as an output. In the example of FIG. 5A, N amplified alternating voltages $V_1[1]$ through $V_1[N]$ are received as an input. Moreover, the set of output chopper circuits 520B is controlled by the set of control signals EN[1:N].

The set of output chopper circuits 520B includes N output chopper circuits 525B. Each output chopper circuit 525B includes a first input, a second input, a first output, and a second output. The first outputs of each output chopper circuit 525B are connected to each other, and the second outputs of each output chopper circuit 525B are connected to each other. Additionally, each output chopper circuit 525B in the set of output chopper circuits 520B is controlled by a corresponding control signal from the set of control signals EN[1:N].

Figure 5B:
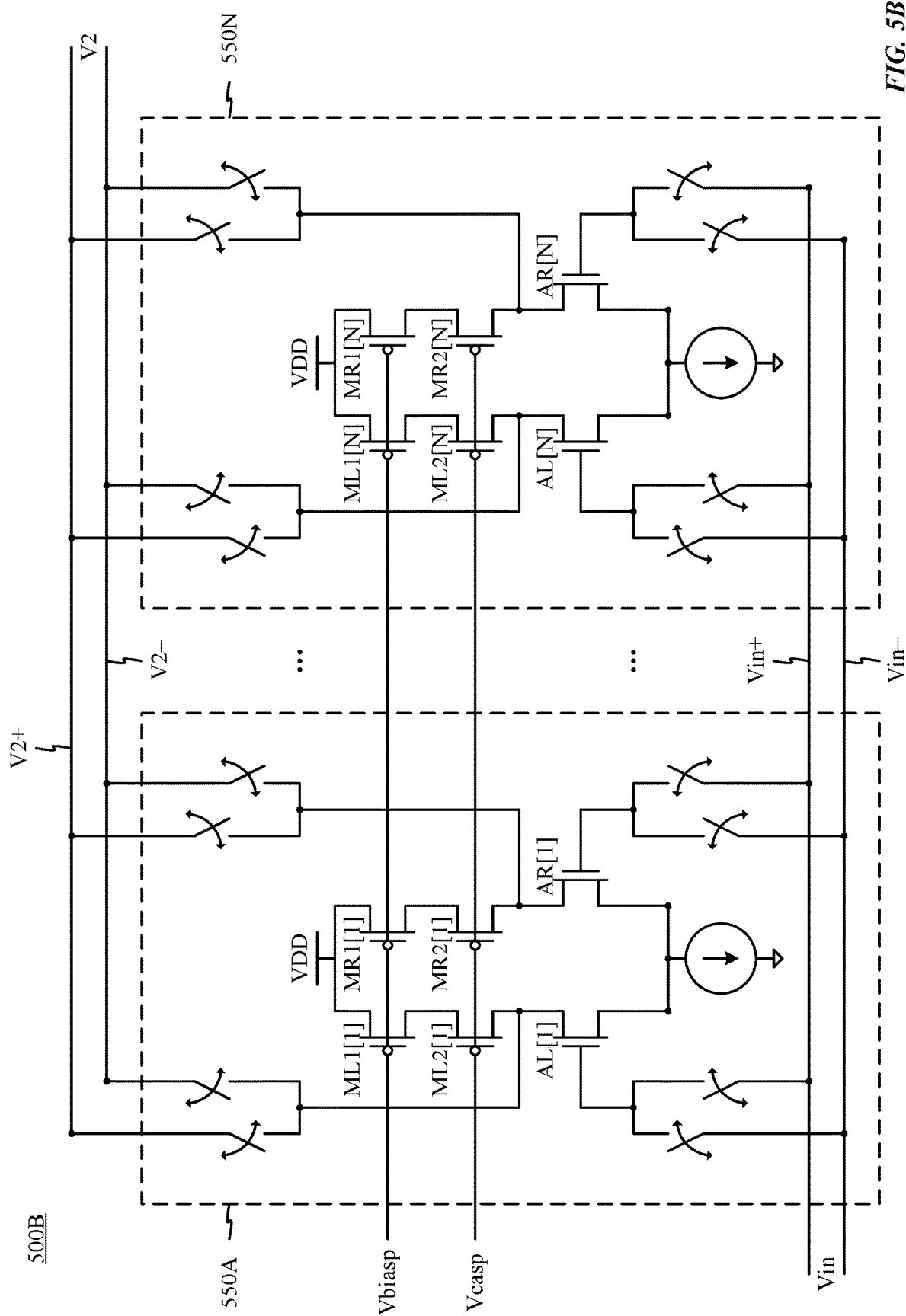
FIG. 5B is a circuit diagram of the amplifier circuit of FIG. 5A, according to one or more embodiments.
Figure 5C:
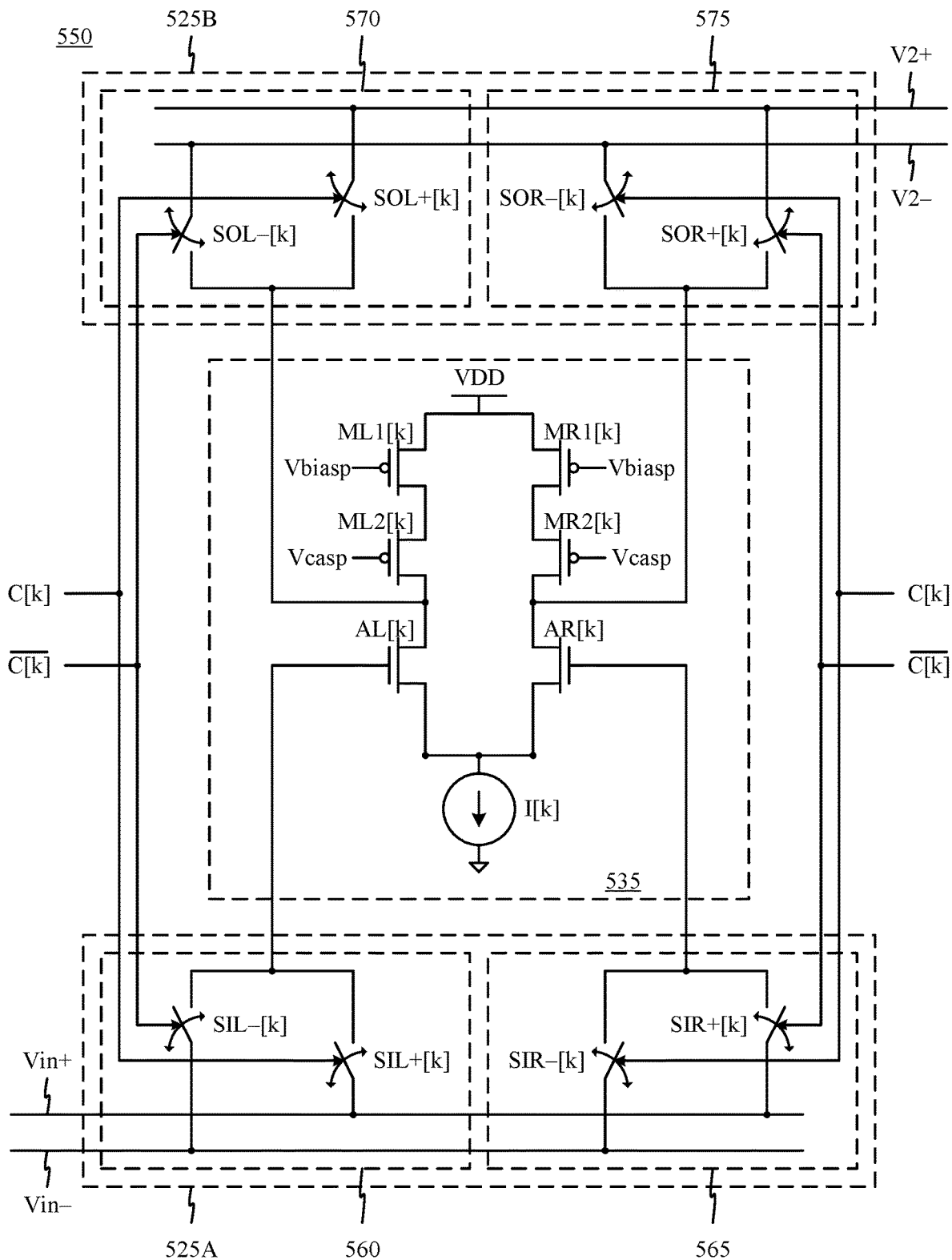
FIG. 5C is a detailed circuit diagram of an amplifier cell used in the amplifier circuits of FIGS. 5A and 5B, according to one or more embodiments.

FIG. 5B is a circuit diagram of the amplifier circuit of FIG. 5A, according to one or more embodiments. The amplifier circuit 500B includes multiple cells 550. Each cell 550 is connected to the first input voltage terminal Vin+, the second input voltage terminal Vin−, the first output voltage terminal V2+, and the second output voltage terminal V2−. FIG. 5C shows a detailed circuit diagram of an amplifier cell used in the amplifier circuits of FIGS. 5A and 5B, according to one or more embodiments. In particular, FIG. 5C illustrates a detailed circuit diagram for the k-th amplifier cell used in the amplifier circuits of FIGS. 5A and 5B.

The amplifier cell 550 includes an input chopper circuit 525A, and output chopper circuit 525B, and a differential amplifier 535. The differential amplifier includes a left transistor AL[k] and a right transistor AR[k]. The left transistor AL[k] and the right transistor AR[k] include a source terminal that are coupled to each other, and to a current source I[k]. The left transistor additionally includes a drain terminal coupled to transistors ML1[k] and ML2[k]. Similarly, the right transistor includes a drain terminal coupled to transistors MR1[k] and MR2[k]. The transistors ML1[k] and MR1[k] receive a first bias voltage Vbiasp, and the transistors ML2[k] and MR2[k] receive a second bias voltage Vcasp. The first bias voltage Vbiasp sets a current level through transistors ML1[k] and MR1[k]. Transistors ML2[k] and MR2[k] act as cascading transistors to increase the output impedance of transistors ML1[k] and MR1[k], increasing the gain of amplifier circuit 500B.

The input chopper circuit 525A includes a first half input chopper circuit 560 coupled to the gate terminal of the left transistor AL[k], and a second half input chopper circuit 565 coupled to the gate terminal of the right transistor AR[k]. The first half input chopper circuit 560 includes a first input switch SIL+[k] coupled between the first input voltage terminal Vin+ and the gate terminal of the left transistor AL[k], and a second input switch SIL−[k] coupled between the second input voltage terminal Vin− and the gate terminal of the left transistor AL[k]. The second half input chopper circuit 565 includes a first input switch SIR+[k] coupled between the first input voltage terminal Vin+ and the gate terminal of the right transistor AR[k], and a second input switch SIR−[k] coupled between the second input voltage terminal Vin− and the gate terminal of the right transistor AR[k]. The first input switch SIL+[k] of the first half input chopper circuit 560 and the second input switch SIR−[k] of the second half input chopper circuit 565 receive a control signal EN[k]. The second input switch SIL−[k] and of the first half input chopper circuit 560 and the first input switch SIR+[k] of the second half input chopper circuit 565 receive the inverse control signal EN.

The output chopper circuit 525B includes a first half output chopper circuit 570 coupled to the drain of the left transistor AL[k], and a second half output chopper circuit 575 coupled to the drain terminal of the right transistor AR[k]. The first half output chopper circuit 570 includes a first output switch SOL+[k] coupled between the drain terminal of the left transistor AL[k] and the first output terminal V2+, and a second output switch SOL−[k] coupled between the drain terminal of the left transistor AL[k] and the second output terminal V2−. The second half output chopper circuit 575 includes a first output switch SOR+[k] coupled between the drain terminal of the right transistor AR[k] and the first output terminal V2+, and a second output switch SOR−[k] coupled between the drain terminal of the right transistor AR[k] and the second output terminal V2−. The first output switch SOL+[k] of the first half output chopper circuit 570 and the second output switch SOR−[k] of the second half output chopper circuit 575 receive the control signal EN[k]. The second output switch SOL−[k] and of the first half output chopper circuit 570 and the first output switch SOR+[k] of the second half output chopper circuit 575 receive the inverse control signal $\overline{EN[k]}$.

In some embodiments, the amplifier circuit of FIG. 5B uses the timing diagram shown in FIG. 3D. That is, the amplifier circuit 500B uses N control signals EN[1:N] that toggles between a first level and a second level every N cycles. Moreover, each control signal EN is configured to toggle at a different cycle. For example, a first control signal EN[1] for controlling a first cell 550A is configured to switch from the first level to the second level at the beginning of cycle $T_1$, and toggle from the second level to the first level at the beginning of cycle $T_{N+1}$. Moreover, a i-th control signal EN[i] for controlling a first cell 550I is configured to switch from the first level to the second level at the beginning of cycle $T_i$, and toggle from the second level to the first level at the beginning of cycle $T_{N+i}$.

Amplifier Calibration

Figure 6A:
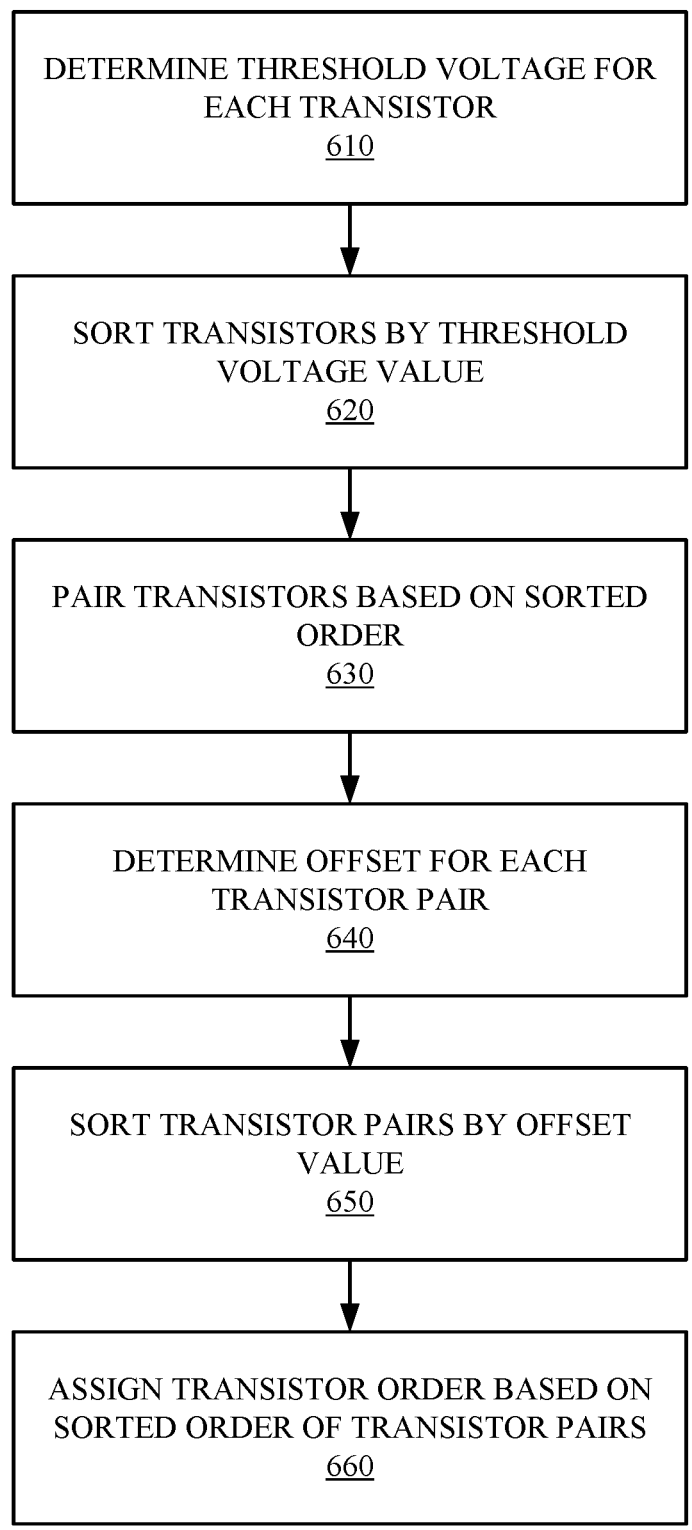
FIG. 6A is a flowchart illustrating a process for calibrating an amplifier circuit, according to one or more embodiments.
Figure 6B:
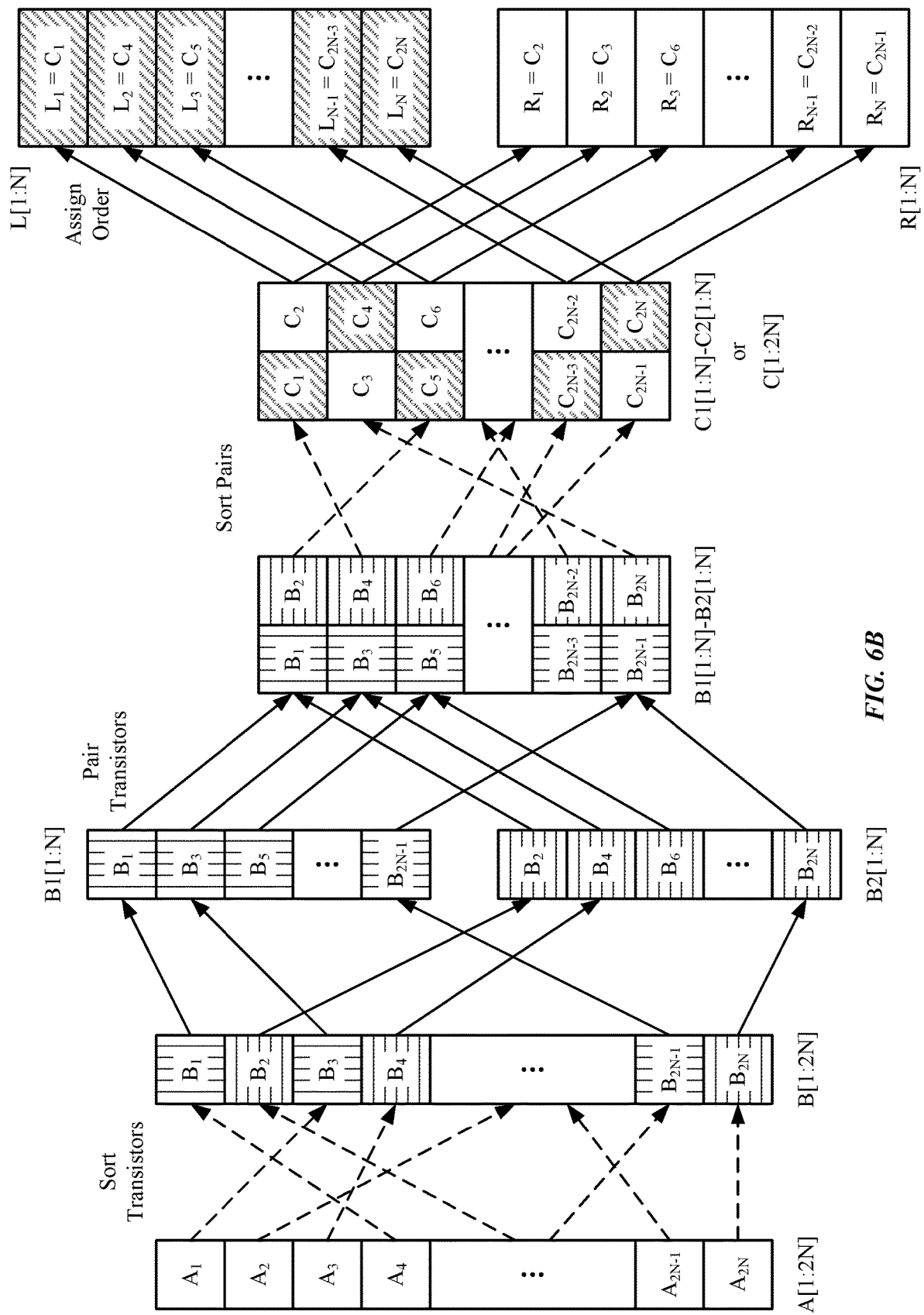
FIG. 6B illustrates an example calibration following the process of FIG. 6A.

FIG. 6A is a flowchart illustrating a process for calibrating an amplifier circuit, according to one or more embodiments. FIG. 6B illustrates an example calibration following the process of FIG. 6A. The calibration process depicted in FIG. 6A may be used with any of the amplifier circuits described above. The controller may first 340 determine 610 a threshold voltage for each transistor A of the array of transistors A[1:2N] used in the differential amplifier 330. Alternatively, this step may be skipped, and the calibration process may be executed by performing a series of threshold voltage comparisons without first determining the actual value of the threshold voltages of each of the transistors.

The controller 340 sorts 620 the transistors A based on their respective threshold voltage values. In some embodiments, array of transistors A[1:2N] are sorted to generate the sorted array of transistors B[1:2N]. In some embodiments, the sorted array of transistors B[1:2N] is further split into two sorted arrays of transistors, B1[1:N] and B2[1:N], each containing half of the elements of the sorted array B[1:2N]. Here, the first sorted array of transistors B1[1:N] contains the odd elements of the sorted array of transistors B[1:2N] and the second sorted array of transistors B2[1:N] contains the even elements of the sorted array of transistors B[1:2N].

In some embodiments, the array of transistors A[1:2N] are sorted without first determining the threshold voltages of each of the transistors. That is, the array of transistors A[1:2N] are sorted by performing comparisons between the threshold voltages of two transistors to determine which transistor of the two has a larger threshold voltage. The process for comparing the threshold voltage of two transistors is described below in conjunction with FIG. 7A.

The controller 340 pairs 630 transistors A based on the sorted order. In some embodiments, the controller 340 pairs transistors A and generates an array of transistor pairs B1[1:N]-B2[1:N]. Each pair of transistors B1[k]-B2[k] in the array of transistor pairs B1[1:N]-B2[1:N] includes a first transistor B1[k] and a second transistor B2[k]. In some embodiments, the controller 340 pairs a transistor corresponding to an odd element in the sorted array of transistors B[1:2N] with an even element in the sorted array of transistors B[1:2N]. For example, the controller 340 pairs a transistor corresponding to an odd element in the sorted array of transistors B[1:2N] with a transistor corresponding to a subsequent element in the sorted array of transistors B[1:2N]. In other embodiments, the controller 340 pairs a transistor in the first sorted array of transistors B1[1:N] with a corresponding element in the second sorted array of transistors B2[1:N].

The controller 340 determines 640 an offset for each transistor pair. That is, the controller 340 determines a difference between the threshold voltage of the first transistor in the pair of transistors and the threshold voltage of the second transistor in the pair of transistors. Since transistors were paired based on the sorted order of transistors, the polarity of each offset will be the same.

The controller 340 sorts 650 the transistor pairs based on the determined offset values. As such, the transistors are sorted in a new order. That is, the array of transistor pairs B1[1:N]-B2[1:N] are sorted to generate a sorted array transistor pairs C1[1:N]-C2[1:N]. Said differently, the sorted array of transistors B[1:2N] are re-sorted to generate a second sorted array of transistors C[1:2N].

In some embodiments, the transistor pairs are sorted without first determining the threshold voltages of each of the transistors. That is, the transistor pairs are sorted by performing comparisons between the threshold voltage offsets of two transistor pairs to determine which transistor pair of the two has a larger threshold voltage offset. The process for comparing the threshold voltage offset of two transistor pairs is described below in conjunction with FIG. 7C.

The controller 340 assigns 660 a transistor order based on the sorted order of the transistor pairs. In some embodiments, the controller 340 generates an array of left transistors L[1:N] to be controlled to behave as left transistors AL, and an array of right transistors R[1:N] to be controller to behave as right transistors AR. To assign the transistor order, the controller 340 determines whether a transistor pair is in an odd position or an even position in the sorted array of transistor pairs C1[1:N]-C2[1:2N]. If the transistor pair is in an odd position, the controller 340 assigns the first transistor of the transistor pair to a first side (e.g., left side) and the second transistor of the transistor pair to a second side (e.g., right side). Conversely, if the transistor pair is in an even position, the controller 340 assigns the first transistor of the transistor pair to the second side (e.g., right side) and the second transistor of the transistor pair to the first side (e.g., left side). As such, the threshold voltage offset alternates in polarity between the transistor pairs in odd positions and transistor pairs in even positions, thus reducing the overall offset of the amplifier circuit. That is, the polarity of the threshold voltage offset between the transistor assigned to the first side and the transistor assigned to the second side for a given transistor pair depends on whether the transistor pair was in an even position or an odd position in the sorted array of transistor pairs. As such, the threshold voltage offset (having a first polarity, e.g., a positive polarity) of transistor pairs that were in an even position will be counterbalanced by the threshold voltage offset (having a second polarity, e.g., a negative polarity) of transistor pairs that were in an odd position.

As used herein, during operation, transistors are "paired" when they are controlled by complementary control signals. That is a first transistor is paired with a second transistor when the half input chopper circuit and the half output chopper circuit of the first transistor is controlled by a first control signal, and the half input chopper circuit and the half output chopper circuit of the second transistor is controlled by a second control signal, complementary to the first control signal (e.g., the second control signal is the inverse of the first control signal). As such, the half input chopper circuit of the first transistor and the half input chopper circuit of the second transistor behave as a full input chopper circuit. Additionally, the half output chopper circuit of the first transistor and the half output chopper circuit of the second transistor behave as a full output chopper circuit.

Moreover, as used herein, during operation, a transistor is "assigned" to a first side when the transistor is controlled by a control signal that transitions from a first level (e.g., LO) to a second level (e.g., HI) during the first half of a control period T, and transitions from the second level to the first level during the second half of the control period T. Moreover, a transistor is "assigned" to a second side when the transistor is controlled by a control signal that transitions from the second level (e.g., HI) to the first level (e.g., LO) during the first half of the control period T, and transitions from the first level to the second level during the second half of the control period T. As a result, transistors "assigned" to the first side are switched from amplifying a first input signal (e.g., Vin+) to amplifying a second input signal (e.g., Vin−) at some point during the first half of the control period T, while a corresponding transistor "assigned" to the second side is switched from amplifying the second input signal to amplifying the first input signal. Furthermore, transistors "assigned" to the first side are switched from amplifying the second input signal (e.g., Vin−) to amplifying the first input signal (e.g., Vin+) at some point during the second half of the control period T, while a corresponding transistor "assigned" to the second side is switched from amplifying the first input signal to amplifying the second input signal.

Threshold Voltage Analysis

Figure 7A:
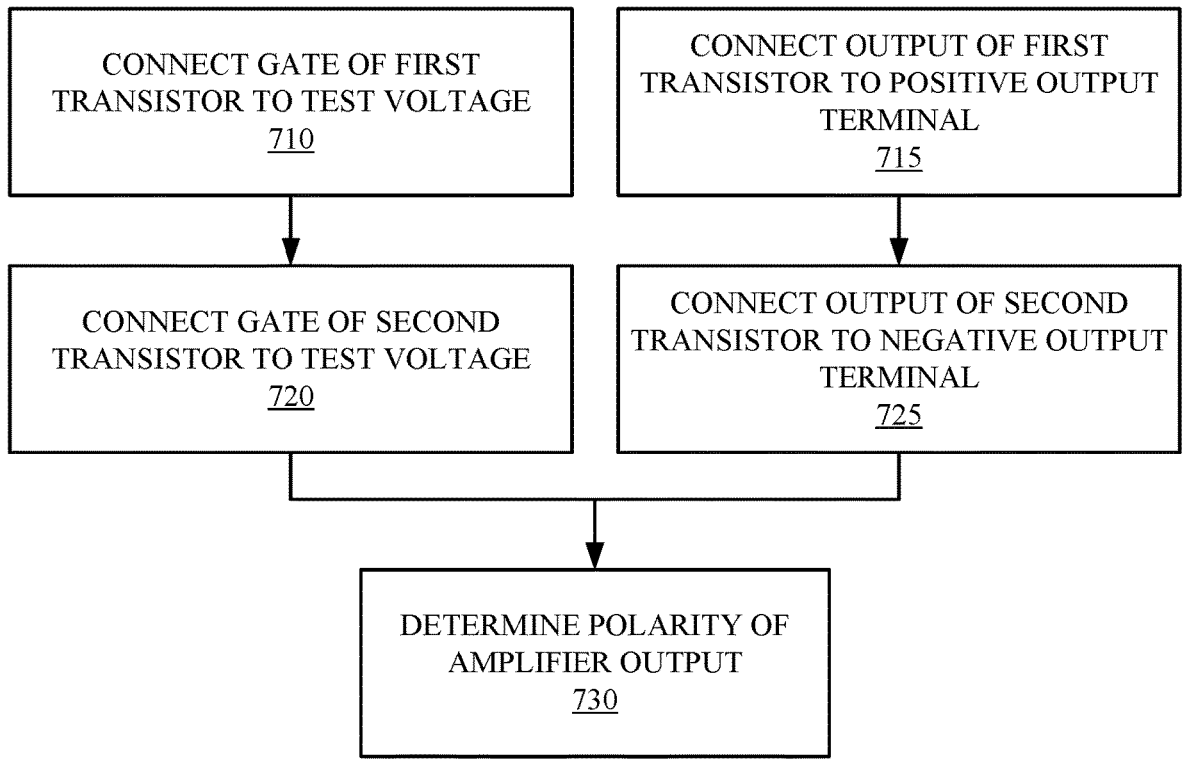
FIG. 7A is a flowchart illustrating a process for comparing threshold voltages of two transistors, according to one or more embodiments.
Figure 7B:
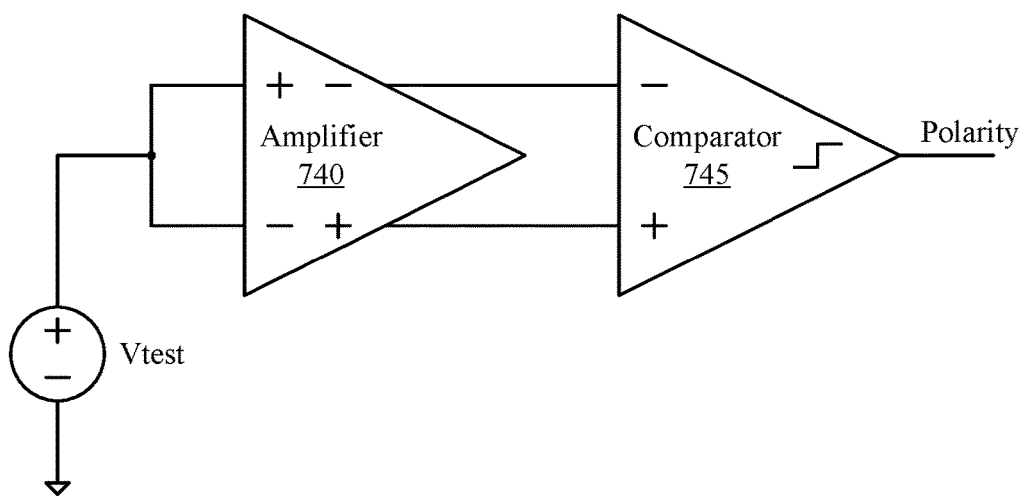
FIG. 7B is a circuit diagram for testing the threshold voltages of transistors, according to one or more embodiments.

FIG. 7A is a flowchart illustrating a process for comparing threshold voltages of two transistors, according to one or more embodiments. FIG. 7B is a circuit diagram for testing the threshold voltages of transistors, according to one or more embodiments.

The controller 340 connects 710 the gate of a first transistor A[i] to a test voltage Vtest. In some embodiments, the controller 340 closes the first input switch SI+[i] of the half input chopper circuit 360 of the first transistor A[i] to connect the gate of the first transistor A[i] to the positive input terminal Vin+ of the amplifier circuit 740. Alternatively, the controller 340 closes the second input switch SI−[i] of the half input chopper circuit 360 of the first transistor A[i] to connect the gate of the first transistor A[i] to the negative input terminal Vin− of the amplifier circuit 740. Alternatively, the controller 340 closes the first input switch SI+[i] and the second input switch SI−[i] of the half input chopper circuit 360 of the first transistor A[i] to connect the gate of the first transistor A[i] to both the positive and negative input terminals of the amplifier circuit 740.

The controller 340 connects 715 the output of the first transistor A[i] to the positive output terminal V2+ of the amplifier circuit 740. In some embodiments, the controller 340 closes the first output switch SO+[i] of the half output chopper circuit 370 of the first transistor A[i].

The controller 340 connects 720 the gate of a second transistor A[k] to a test voltage Vtest. In some embodiments, the controller 340 closes the first input switch SI+[k] of the half input chopper circuit 360 of the second transistor A[k] to connect the gate of the second transistor A[k] to the positive input terminal Vin+ of the amplifier circuit 740. Alternatively, the controller 340 closes the second input switch SI−[k] of the half input chopper circuit 360 of the second transistor A[k] to connect the gate of the second transistor A[k] to the negative input terminal Vin− of the amplifier circuit 740. Alternatively, the controller 340 closes the first input switch SI+[k] and the second input switch SI−[k] of the half input chopper circuit 360 of the second transistor A[k] to connect the gate of the second transistor A[k] to both the positive and negative input terminals of the amplifier circuit 740.

The controller 340 connects 725 the output of the second transistor A[k] to the negative output terminal V2− of the amplifier circuit 740. In some embodiments, the controller 340 closes the second output switch SO−[k] of the half output chopper circuit 370 of the second transistor A[k].

The controller 340 then determines a polarity of the output of the amplifier circuit 740. In some embodiments, the controller 340 uses a comparator 745 for determining the polarity of the output of the amplifier circuit 740. Based on the polarity of the output of the amplifier circuit 740, the controller determines which transistor has a larger threshold voltage. For example, if the output of the comparator 745 has a first value (e.g., HI), the controller 340 determines that the threshold voltage of the first transistor is larger than threshold voltage of the second transistor. Conversely, if the output of the comparator 745 has a second value (e.g., LO), the controller 340 determines that the threshold voltage of the second transistor is larger than the threshold voltage of the first transistor.

Based on these comparisons, the controller 340 is able to sort the array of transistors A[1:2N] based on their respective threshold voltages. That is, when sorting, the array of transistors A[1:2N] to generate the sorted array of transistors B[1:2N], the controller 340 picks two transistors to test which transistor has the larger threshold voltage value and performs the steps of FIG. 7A to make the determination.

Figure 7C:
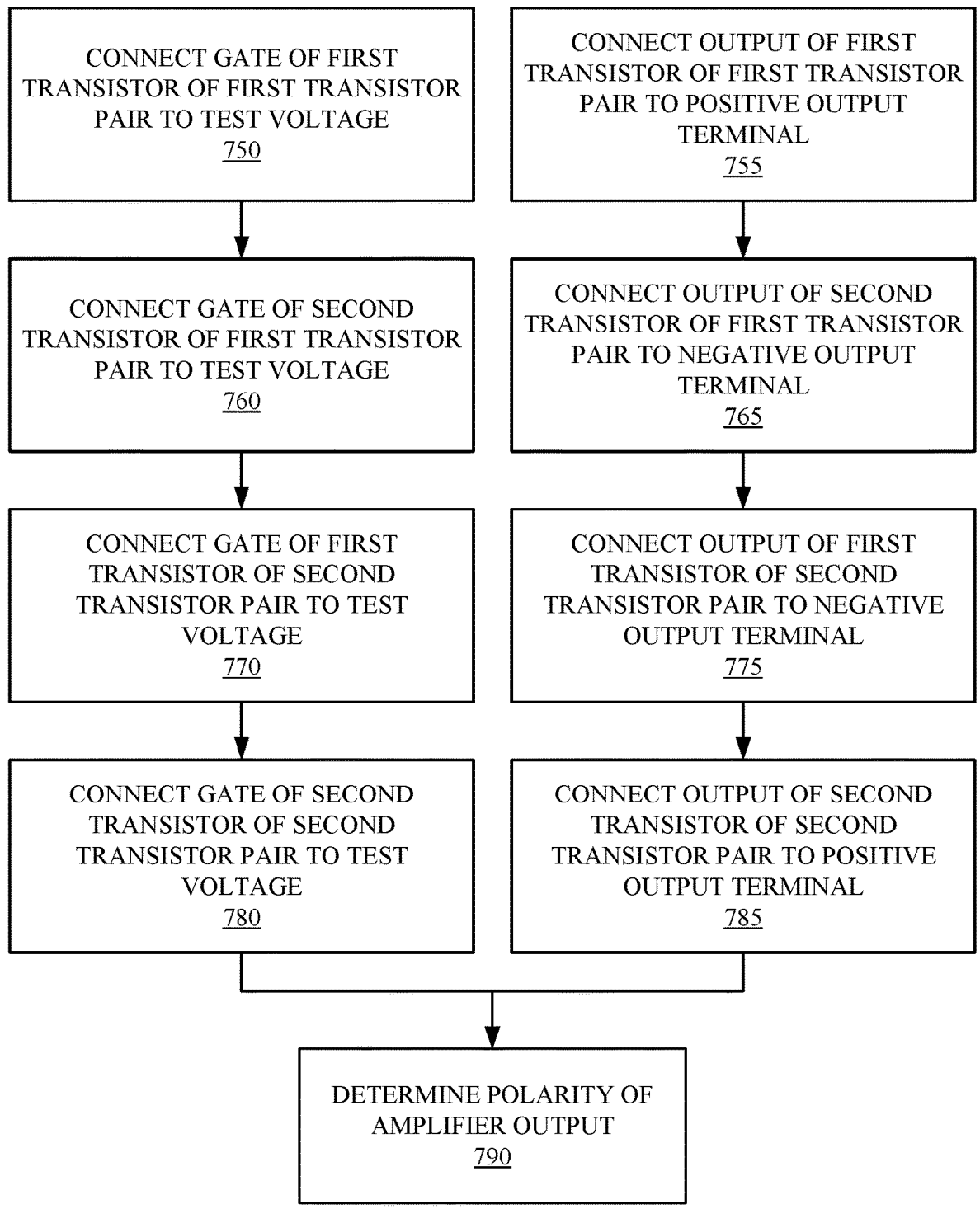
FIG. 7C is a flowchart illustrating a process for threshold voltage offsets between two transistor pairs, according to one or more embodiments.

FIG. 7C is a flowchart illustrating a process for threshold voltage offsets between two transistor pairs, according to one or more embodiments. When sorting the transistor pairs in step 650 of FIG. 6A, the threshold voltage offsets (threshold voltage difference) between pairs of transistors are compared. That is, the threshold voltage offset of a first transistor pair is compared to the threshold voltage offset of a second transistor pair.

The controller 340 controls the half input chopper circuit 360 of the first transistor of the first transistor pair to connect 750 the gate of the first transistor of the first transistor pair to a test voltage. Moreover, the controller 340 controls the half output chopper circuit 370 of the first transistor of the first transistor pair to connect 755 the output of the first transistor of the first transistor pair to the positive output terminal V2+ of the amplifier circuit 740.

In some embodiments, to connect the gate of the first transistor of the first transistor pair to the test voltage, the controller 340 closes the first input switch SI+ of the half input chopper circuit 360 to connect the gate of the first transistor of the first transistor pair to the positive input terminal Vin+ of the amplifier circuit 740. Alternatively, the controller 340 closes the second input switch SI− of the half input chopper circuit 360 to connect the gate of the first transistor of the first transistor pair to the negative input terminal Vin− of the amplifier circuit 740. Alternatively, the controller 340 closes the first input switch SI+ and the second input switch SI− of the half input chopper circuit 360 to connect the gate of the first transistor of the first transistor pair to both the positive and negative input terminals of the amplifier circuit 740.

The controller 340 controls the half input chopper circuit 360 of the second transistor of the first transistor pair to connect 760 the gate of the second transistor of the first transistor pair to the test voltage. Moreover, the controller 340 controls the half output chopper circuit 370 of the second transistor of the first transistor pair to connect 765 the output of the first transistor of the first transistor pair to the negative output terminal V2− of the amplifier circuit 740.

In some embodiments, to connect the gate of the second transistor of the first transistor pair to the test voltage, the controller 340 closes the second input switch SI− of the half input chopper circuit 360 to connect the gate of the second transistor of the first transistor pair to the negative input terminal Vin− of the amplifier circuit 740. Alternatively, the controller 340 closes the first input switch SI+ of the half input chopper circuit 360 to connect the gate of the second transistor of the first transistor pair to the positive input terminal Vin+ of the amplifier circuit 740. Alternatively, the controller 340 closes the first input switch SI+ and the second input switch SI− of the half input chopper circuit 360 to connect the gate of the second transistor of the first transistor pair to both the positive and negative input terminals of the amplifier circuit 740.

The controller 340 controls the half input chopper circuit 360 of the first transistor of the second transistor pair to connect 770 the gate of the first transistor of the second transistor pair to the test voltage. Moreover, the controller 340 controls the half output chopper circuit 370 of the first transistor of the second transistor pair to connect 775 the output of the first transistor of the second transistor pair to the negative output terminal V2− of the amplifier circuit 740.

In some embodiments, to connect the gate of the first transistor of the second transistor pair to the test voltage, the controller 340 closes the second input switch SI− of the half input chopper circuit 360 to connect the gate of the second transistor of the first transistor pair to the negative input terminal Vin− of the amplifier circuit 740. Alternatively, the controller 340 closes the first input switch SI+ of the half input chopper circuit 360 to connect the gate of the first transistor of the second transistor pair to the positive input terminal Vin+ of the amplifier circuit 740. Alternatively, the controller 340 closes the first input switch SI+ and the second input switch SI− of the half input chopper circuit 360 to connect the gate of the first transistor of the second transistor pair to both the positive and negative input terminals of the amplifier circuit 740.

The controller 340 controls the half input chopper circuit 360 of the second transistor of the second transistor pair to connect 780 the gate of the second transistor of the second transistor pair to the test voltage. Moreover, the controller 340 controls the half output chopper circuit 370 of the second transistor of the second transistor pair to connect 775 the output of the second transistor of the second transistor pair to the positive output terminal V2+ of the amplifier circuit 740.

In some embodiments, to connect the gate of the second transistor of the second transistor pair to the test voltage, the controller 340 closes the first input switch SI+ of the half input chopper circuit 360 to connect the gate of the second transistor of the second transistor pair to the positive input terminal Vin+ of the amplifier circuit 740. Alternatively, the controller 340 closes the second input switch SI− of the half input chopper circuit 360 to connect the gate of the second transistor of the second transistor pair to the negative input terminal Vin− of the amplifier circuit 740. Alternatively, the controller 340 closes the first input switch SI+ and the second input switch SI− of the half input chopper circuit 360 to connect the gate of the second transistor of the second transistor pair to both the positive and negative input terminals of the amplifier circuit 740.

The controller 340 then determines a polarity of the output of the amplifier circuit 740. In some embodiments, the controller 340 uses the comparator 745 for determining the polarity of the output of the amplifier circuit 740. Based on the polarity of the output of the amplifier circuit 740, the controller determines which transistor pair has a larger threshold voltage offset. For example, if the output of the comparator 745 has a first value (e.g., HI), the controller 340 determines that the threshold voltage offset of the first transistor pair is larger than threshold voltage offset of the second transistor pair. Conversely, if the output of the comparator 745 has a second value (e.g., LO), the controller 340 determines that the threshold voltage offset of the second transistor pair is larger than the threshold voltage offset of the first transistor pair.

Additional Considerations

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. An amplifier circuit comprising:
a plurality of transistors including a first subset of transistors and a second subset of transistors, each transistor of the plurality of transistors configured to receive an input signal and output an amplified signal;
a plurality of input chopper circuits, an input chopper circuit of the plurality of input chopper circuits controlled by a control signal from a plurality of control signals, the input chopper circuit coupled to a transistor pair including a first transistor from the first subset of transistors and a second transistor from the second subset of transistors, the input chopper circuit configured to selectively connect each transistor of the transistor pair to a first input terminal of the amplifier circuit or a second input terminal of the amplifier circuit based on a value of the control signal, the control signal being based on threshold voltages of the transistor pair; and
a plurality of output chopper circuits, an output chopper circuit of the plurality of output chopper circuits corresponding to the input chopper circuit, the output chopper circuit controlled by the control signal, the output chopper circuit configured to selectively connect a drain terminal of each transistor of the transistor pair directly to a first output voltage terminal of the amplifier circuit or directly to a second output voltage terminal of the amplifier circuit based on the value of the control signal, the first and second output voltage terminals of the amplifier circuit forming a differential voltage output of the amplifier circuit, the first and second input terminals connected to the first and second output voltage terminals via the input chopper circuit, the transistor pair, and the output chopper circuit based on the control signal.

2. The amplifier circuit of claim 1, wherein the input chopper circuit comprises:
a first half input chopper circuit coupled to an input of the first transistor of the transistor pair, the first half input chopper circuit configured to selectively couple the input of the first transistor to the first input terminal of the amplifier circuit or the second input terminal of the amplifier circuit based on the value of the control signal; and
a second half input chopper circuit coupled to the second transistor of the transistor pair, the second half input chopper circuit configured to selectively couple the input of the second transistor to the first input terminal of the amplifier circuit or the second input terminal of the amplifier circuit based on the value of the control signal.

3. The amplifier circuit of claim 2, wherein:
the first half input chopper circuit comprises:
- a first switch coupled between the first input terminal of the amplifier circuit and the input of the first transistor of the transistor pair, the first switch configured to close when the control signal has a first value and open when the control signal has a second value, and
- a second switch coupled between the second input terminal of the amplifier circuit and the input of the first transistor of the transistor pair, the second switch configured to close when the control signal has the second value and open when the control signal has the first value; and the second half input chopper circuit comprises:
- a third switch coupled between the first input terminal of the amplifier circuit and the input of the second transistor of the transistor pair, the third switch configured to close when the control signal has the first value and open when the control signal has the second value, and
- a fourth switch coupled between the second input terminal of the amplifier circuit and the input of the second transistor of the transistor pair, the fourth switch configured to close when the control signal has the second value and open when the control signal has the first value.

4. The amplifier circuit of claim 1, wherein the output chopper circuit comprises:
- a first half output chopper circuit coupled to an output of the first transistor of the transistor pair, the first half output chopper circuit configured to selectively couple the output of the first transistor to the first output voltage terminal of the amplifier circuit or the second output voltage terminal of the amplifier circuit based on the value of the control signal; and
- a second half output chopper circuit coupled to an output of the second transistor of the transistor pair, the second half output chopper circuit configured to selectively couple the output of the second transistor to the first output voltage terminal of the amplifier circuit or the second output voltage terminal of the amplifier circuit based on the value of the control signal.

5. The amplifier circuit of claim 2, wherein:
the first half output chopper circuit comprises:
- a first switch coupled between the first output voltage terminal of the amplifier circuit and the output of the first transistor of the transistor pair, the first switch configured to close when the control signal has a first value and open when the control signal has a second value, and
- a second switch coupled between the second output voltage terminal of the amplifier circuit and the output of the first transistor of the transistor pair, the second switch configured to close when the control signal has the second value and open when the control signal has the first value; and the second half output chopper circuit comprises:
- a third switch coupled between the first output voltage terminal of the amplifier circuit and the output of the second transistor of the transistor pair, the third switch configured to close when the control signal has the first value and open when the control signal has the second value, and
- a fourth switch coupled between the second output voltage terminal of the amplifier circuit and the output of the second transistor of the transistor pair, the fourth switch configured to close when the control signal has the second value and open when the control signal has the first value.

6. The amplifier circuit of claim 1, further comprising:
a controller circuit coupled to the plurality of input chopper circuits and the plurality of output chopper circuits, the controller configured to generate the plurality of control signals by pairing transistors from the plurality of transistors based on a threshold voltage of each of the plurality of transistors and determining an order for each transistor pair from the plurality of transistors based on a threshold voltage offset of each transistor pair.

7. The amplifier circuit of claim 6, further comprising:
a comparator comprising:
- a first input coupled to the first output voltage terminal of the amplifier circuit, and
- a second input coupled to the second output voltage terminal of the amplifier circuit,
- the comparator configured to generate an output polarity signal having a first value responsive to a voltage level at the first output voltage terminal being greater than a voltage level at the second output voltage terminal, and having a second value responsive to the voltage level at the second output voltage terminal being greater than the voltage level at the first output voltage terminal.

8. The amplifier circuit of claim 1, wherein the plurality of input chopper circuits comprises:
- a first input chopper circuit coupled to a first transistor pair from the plurality of transistors, the first input chopper circuit controlled by a first control signal from the plurality of control signals, wherein the first control signal transitions from a first value to a second value during a first cycle and transitions from the second value to the first value during a second cycle; and
- a second input chopper circuit coupled to a second transistor pair from the plurality of transistors, the second input chopper circuit controlled by a second control signal from the plurality of control signals, wherein the second control signal transitions from the first value to the second value during a third cycle different than the first cycle and the second cycle and transitions from the second value to the first value during a fourth cycle different than the first cycle and the second cycle.

9. The amplifier circuit of claim 8, wherein:
a first input terminal of the first input chopper circuit is coupled to a first input terminal of the second input chopper circuit; and
a second input terminal of the first input chopper circuit is coupled to a second input terminal of the second input chopper circuit.

10. The amplifier circuit of claim 8, wherein:
a first output terminal of the first input chopper circuit is coupled to a first transistor of the first transistor pair;
a second output terminal of the first input chopper circuit is coupled to a second transistor of the first transistor pair;
a first output terminal of the second input chopper circuit is coupled to a first transistor of the second transistor pair; and
a second output terminal of the second input chopper circuit is coupled to a second transistor of the second transistor pair.

11. The amplifier circuit of claim 8, wherein the plurality of output chopper circuits comprises:

a first output chopper circuit coupled to the first transistor pair, the first output chopper circuit controlled by the first control signal; and a second output chopper circuit coupled to the second transistor pair, the second output chopper circuit controlled by the second control signal.

12. The amplifier circuit of claim 11, wherein:
a first output terminal of the first output chopper circuit is coupled to a first output terminal of the second output chopper; and
a second output terminal of the first output chopper circuit is coupled to a second output terminal of the second output chopper circuit.

13. The amplifier circuit of claim 11, wherein:
a first input terminal of the first output chopper circuit is coupled to the first transistor of the first transistor pair;
a second input terminal of the first output chopper circuit is coupled to the second transistor of the first transistor pair;
a first input terminal of the second output chopper circuit is coupled to the first transistor of the second transistor pair; and
a second input terminal of the second output chopper circuit is coupled to the second transistor of the second transistor pair.

14. A method for controlling an amplifier circuit, comprising:
receiving a first input signal through a first input terminal of the amplifier circuit and a second input signal through a second input terminal of the amplifier circuit;
selectively connecting each transistor of a plurality of transistors to the first input terminal of the amplifier circuit or the second input terminal of the amplifier circuit via a respective input chopper circuit of a plurality of input chopper circuits that is controlled based on a value of a respective control signal from a plurality of control signals wherein each respective control signal of the plurality of controls signals is based on a respective threshold voltage of a respective transistor of the plurality of transistors;
selectively connecting a drain terminal of each transistor of the plurality of transistors directly to a first output voltage terminal of the amplifier circuit or directly to a second output voltage terminal of the amplifier circuit via a respective output chopper circuit of a plurality of output chopper circuits that is controlled based on the value of the respective control signal;
connecting the first and second input terminals to the first and second output voltage terminals via the input chopper circuit, the plurality of transistors, and the output chopper circuit based on the control signal; and
amplifying, by the plurality of transistors, the first input signal and the second input signal to generate a differential output of the amplifier circuit formed by the first and second output voltage terminals.

15. The method of claim 14, wherein selectively connecting each transistor of the plurality of transistors to the first input terminal of the amplifier circuit or the second input terminal of the amplifier circuit comprises:
in response to receiving the control signal having a first value, connecting a first transistor of a first transistor pair from the plurality of transistors to the first input terminal and connecting a second transistor of the first transistor pair to the second input terminal; and
in response to receiving the control signal having a second value, connecting the first transistor of the first transistor pair to the second input terminal and connecting the second transistor of the first transistor pair to the first input terminal.

16. The method of claim 15, wherein selectively connecting each transistor of the plurality of transistors to the first output voltage terminal or the second output voltage terminal comprises:
in response to receiving the control signal having the first value, connecting the first transistor of the first transistor pair to the first output voltage terminal and connecting the second transistor of the first transistor pair to the second output voltage terminal; and
in response to receiving the control signal having the second value, connecting the first transistor of the first transistor pair to the second output voltage terminal and connecting the second transistor of the first transistor pair to the first output voltage terminal.

17. The method of claim 14, wherein selectively connecting each transistor of the plurality of transistors to the first input terminal of the amplifier circuit or the second input terminal of the amplifier circuit comprises:
during a first cycle:
connecting a first transistor of a first transistor pair from the plurality of transistors to the first input terminal and connecting a second transistor of the first transistor pair to the second input terminal, and
connecting a first transistor of a second transistor pair from the plurality of transistors to the first input terminal and connecting a second transistor of the second transistor pair to the second input terminal;
during a second cycle:
connecting the first transistor of the first transistor pair to the second input terminal and connecting the second transistor of the first transistor pair to the first input terminal, and
connecting the first transistor of the second transistor pair to the first input terminal and connecting the second transistor of the second transistor pair to the second input terminal; and
during a third cycle:
connecting the first transistor of the first transistor pair to the second input terminal and connecting the second transistor of the first transistor pair to the first input terminal, and
connecting the first transistor of the second transistor pair to the second input terminal and connecting the second transistor of the second transistor pair to the first input terminal.

18. The method of claim 17, wherein selectively connecting each transistor of the plurality of transistors to the first output voltage terminal or the second output voltage terminal comprises:
during the first cycle:
connecting the first transistor of the first transistor pair to the first output voltage terminal and connecting the second transistor of the first transistor pair to the second output voltage terminal, and
connecting the first transistor of the second transistor pair to the first output voltage terminal and connecting the second transistor of the second transistor pair to the second output voltage terminal;
during the second cycle:
connecting the first transistor of the first transistor pair to the second output voltage terminal and connecting the second transistor of the first transistor pair to the first output voltage terminal, and connecting the first transistor of the second transistor pair to the first output voltage terminal and connecting the second transistor of the second transistor pair to the second output voltage terminal; and during the third cycle:
connecting the first transistor of the first transistor pair to the second output voltage terminal and connecting the second transistor of the first transistor pair to the first output voltage terminal, and
connecting the first transistor of the second transistor pair to the second output voltage terminal and connecting the second transistor of the second transistor pair to the first output voltage terminal.

19. The method of claim 14, further comprising:
pairing transistors from the plurality of transistors based on the respective threshold voltage of each respective transistor of the plurality of transistors;
determining a transistor pair order for each transistor pair from the plurality of transistors based on a threshold voltage offset of each transistor pair; and
generating the plurality of control signals based on the determined transistor pair order.

20. The method of claim 19, wherein pairing transistors from the plurality of transistors based on the respective threshold voltage of each respective transistor of the plurality of transistors comprises:
sorting the plurality of transistors based on the respective threshold voltage of each respective transistor of the plurality of transistors to determine a sorted order of transistors; and
pairing the plurality of transistors based on the determined sorted order of transistors.

21. The method of claim 20, wherein pairing the plurality of transistors based on the determined sorted order of transistors comprises:
pairing a first transistor of the plurality of transistors at an odd position in the sorted order of transistors with a second transistor of the plurality of transistors at an even position in the sorted order of transistors.

22. The method of claim 21, further comprising:
assigning each transistor of each transistor pair of the plurality of transistors to a first subset of transistors of the plurality of transistors or a second subset of transistors of the plurality of transistors based on a position of each transistor pair in the determined transistor pair order.

23. An electronic device comprising:
an amplifier circuit comprising:
a plurality of transistors including a first subset of transistors and a second subset of transistors, each transistor of the plurality of transistors configured to receive an input signal and output an amplified signal;
a plurality of input chopper circuits, an input chopper circuit of the plurality of input chopper circuits controlled by a control signal from a plurality of control signals, the input chopper circuit coupled to a transistor pair including a first transistor from the first subset of transistors and a second transistor from the second subset of transistors, the input chopper configured to selectively connect each transistor of the transistor pair to a first input terminal of the amplifier circuit or a second input terminal of the amplifier circuit based on a value of the control signal the control signal being based on threshold voltages of the transistor pair; and
a plurality of output chopper circuits, an output chopper circuit of the plurality of output chopper circuits corresponding to the input chopper circuit, the output chopper circuit controlled by the control signal, the output chopper circuit configured to selectively connect a drain terminal of each transistor of the transistor pair directly to a first output voltage terminal of the amplifier circuit or directly to a second output voltage terminal of the amplifier circuit based on the value of the control signal, the first and second output voltage terminals of the amplifier circuit forming a differential voltage output of the amplifier circuit, the first and second input terminals connected to the first and second output voltage terminals via the input chopper circuit, the transistor pair, and the output chopper circuit based on the control signal.

24. The electronic device of claim 23, wherein:
the input chopper circuit comprises:
a first half input chopper circuit coupled to an input of the first transistor of the transistor pair, the first half input chopper circuit configured to selectively couple the input of the first transistor to the first input terminal of the amplifier circuit or the second input terminal of the amplifier circuit based on the value of the control signal, and
a second half input chopper circuit coupled to the second transistor of the transistor pair, the second half input chopper circuit configured to selectively couple the input of the second transistor to the first input terminal of the amplifier circuit or the second input terminal of the amplifier circuit based on the value of the control signal; and
the output chopper circuit comprises:
a first half output chopper circuit coupled to an output of the first transistor of the transistor pair, the first half output chopper circuit configured to selectively couple the output of the first transistor to the first output voltage terminal of the amplifier circuit or the second output voltage terminal of the amplifier circuit based on the value of the control signal, and
a second half output chopper circuit coupled to an output of the second transistor of the transistor pair, the second half output chopper circuit configured to selectively couple the output of the second transistor to the first output voltage terminal of the amplifier circuit or the second output voltage terminal of the amplifier circuit based on the value of the control signal.

\* \* \* \* \*

UNITED STATES PATENT AND TRADEMARK OFFICE
CERTIFICATE OF CORRECTION

PATENT NO. : 11,936,352 B2
APPLICATION NO. : 17/154939
DATED : March 19, 2024
INVENTOR(S) : Ozalevli et al.

It is certified that error appears in the above-identified patent and that said Letters Patent is hereby corrected as shown below:

In the Specification

In Column 5, Line 2, after "terminal" insert -- $V_1$- --.

In Column 6, Line 5, delete "to" and insert -- two --, therefor.

In the Claims

In Column 25, Claim 12, Line 10, delete "chopper;" and insert -- chopper circuit; --, therefor.

In Column 26, Claim 18, Lines 50-51, after "connecting" insert -- the drain terminal of --.

In Column 26, Claim 18, Line 51, after "transistors" insert -- directly --.

In Column 26, Claim 18, Line 52, after "or" insert -- directly to --.

Signed and Sealed this
Thirtieth Day of April, 2024

Katherine Kelly Vidal
*Director of the United States Patent and Trademark Office*